US007686071B2

(12) United States Patent
Silverstein

(10) Patent No.: US 7,686,071 B2
(45) Date of Patent: Mar. 30, 2010

(54) BLADE-THRU CONDENSER HAVING REEDS AND HEAT DISSIPATION SYSTEM THEREOF

(75) Inventor: Paul Silverstein, Miami, FL (US)

(73) Assignee: ArticChoke Enterprises LLC, Miami, FL (US)

( * ) Notice: Subject to any disclaimer, the term of this patent is extended or adjusted under 35 U.S.C. 154(b) by 128 days.

(21) Appl. No.: 11/494,238

(22) Filed: Jul. 27, 2006

(65) Prior Publication Data

US 2007/0025078 A1 Feb. 1, 2007

Related U.S. Application Data

(60) Provisional application No. 60/703,945, filed on Jul. 30, 2005, provisional application No. 60/797,848, filed on May 6, 2006.

(51) Int. Cl.
*F28B 1/06* (2006.01)
(52) U.S. Cl. .................. 165/110; 165/104.21
(58) Field of Classification Search ............ 165/104.21, 165/104.33, 110, 146, 147, 166, DIG. 185, 165/DIG. 186, DIG. 198, DIG. 461, DIG. 462, 165/DIG. 463, 84; 361/700, 701, 702, 703
See application file for complete search history.

(56) References Cited

U.S. PATENT DOCUMENTS

| | | | | | |
|---|---|---|---|---|---|
| 1,935,332 A | * | 11/1933 | Quarnstrom | ............... | 165/151 |
| 1,940,804 A | * | 12/1933 | Karmazin | ................ | 165/151 |
| 2,345,204 A | * | 3/1944 | Lodwig | ................. | 165/104.34 |
| 2,805,931 A | * | 9/1957 | Hatcher et al. | ............... | 75/505 |
| 3,311,165 A | * | 3/1967 | Karmazin | ................... | 165/179 |
| 3,830,293 A | * | 8/1974 | Bell | .......................... | 165/174 |
| 4,058,980 A | * | 11/1977 | Ahlen | ...................... | 165/167 |
| 6,526,768 B2 | * | 3/2003 | Wall et al. | ...................... | 62/184 |
| 6,742,574 B2 | * | 6/2004 | Sugito et al. | ........... | 165/104.21 |
| 2003/0205363 A1 | * | 11/2003 | Chu et al. | .................. | 165/80.3 |
| 2004/0070949 A1 | * | 4/2004 | Oikawa et al. | ......... | 165/104.33 |

OTHER PUBLICATIONS

J. Tehver et al. Heat Transfer and Hysteresis Phenomena in Boiling on Porous Plasma-Sprayed Surface, Experimental Thermal and Fluid Science 1992; 5:714-727.

* cited by examiner

*Primary Examiner*—Teresa J Walberg
(74) *Attorney, Agent, or Firm*—Yi Li

(57) ABSTRACT

A condenser includes a condenser core, input and output manifolds connected therewith. The condenser core has a blade-thru structure, which is formed by a plurality of layers of thin metal blades stacked on top of another by joint interfaces or joined by spacer rings between two adjacent blades. Each layer of the blades includes condensation chamber(s), wherein the floor of the chamber is monolithic with the rest of the blade. The blades are so aligned that the condensation chamber(s) of each blade are on top of the condensation chamber(s) of the blade immediate underneath, thereby forming phase exchange column(s). Each condensation chamber has one or more apertures on the floor thereof, permitting vapor and condensate to pass therethrough and causing vibration of the chamber floor. Further disclosed is a heat dissipation system utilizing the blade-thru condenser, as well as a computer system utilizing the heat dissipation system.

30 Claims, 13 Drawing Sheets

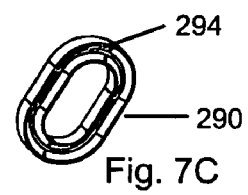
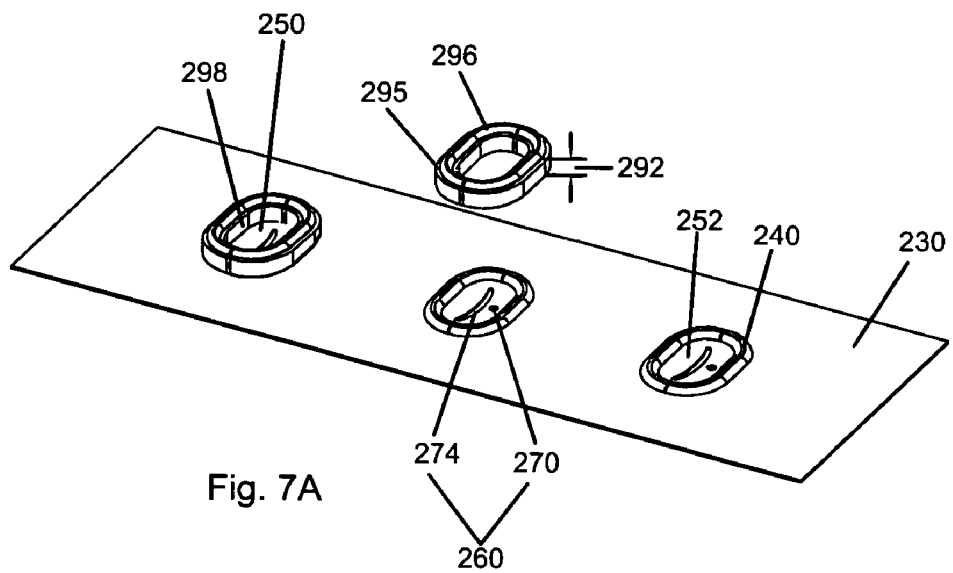
Fig. 7C
Fig. 7A
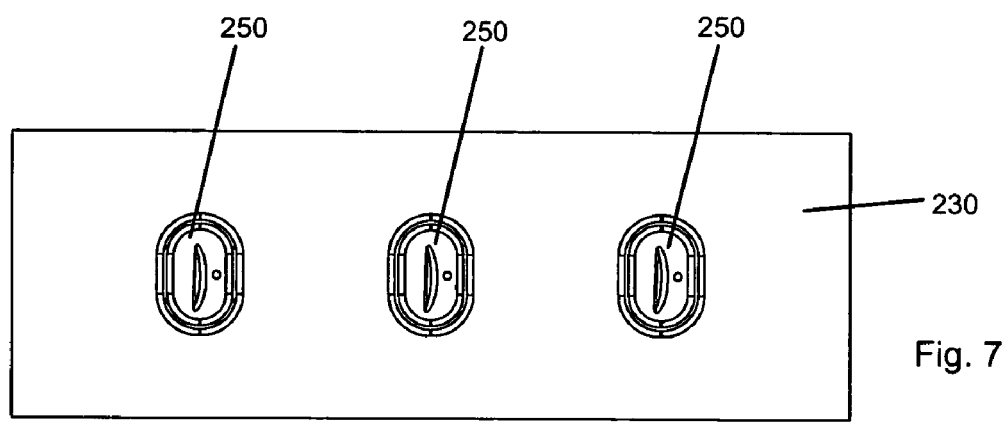
Fig. 7
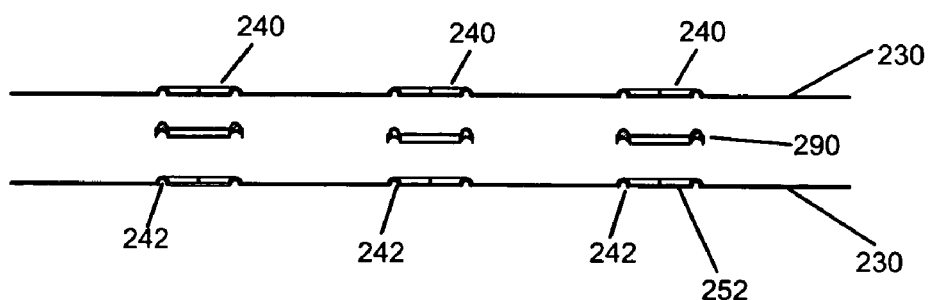
Fig. 7B

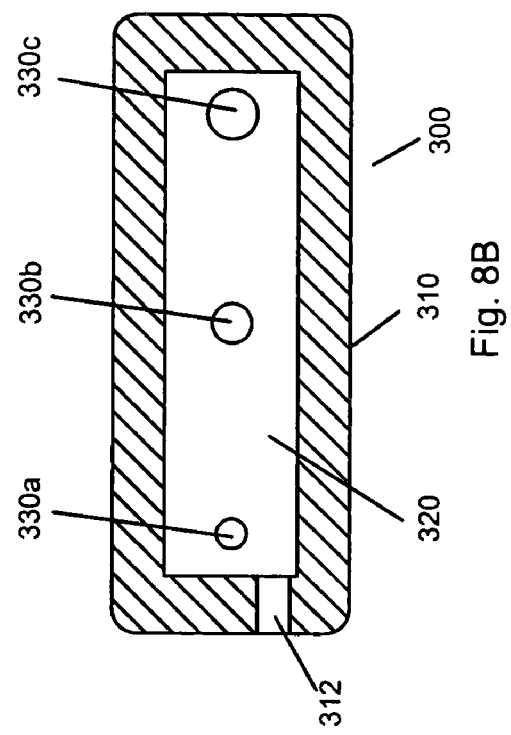
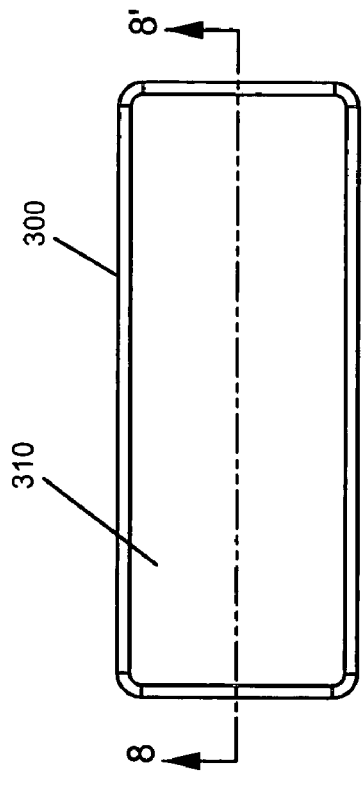
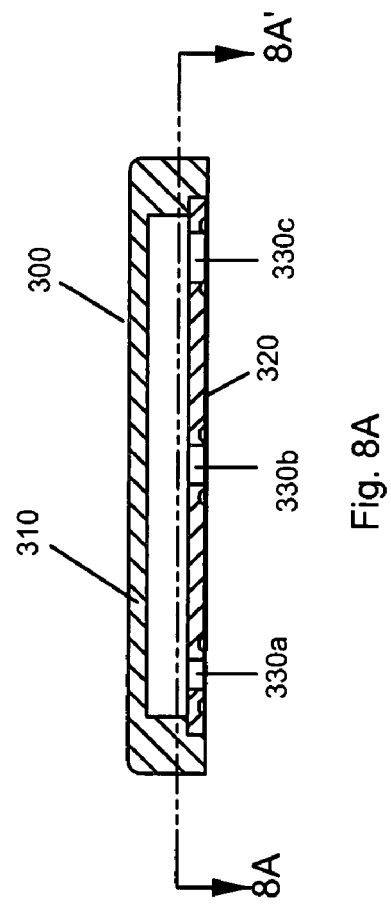

BLADE-THRU CONDENSER HAVING REEDS AND HEAT DISSIPATION SYSTEM THEREOF

CROSS REFERENCE TO RELATED APPLICATION

This application claims the benefit under 35 USC 119(e) of the provisional patent application Ser. No. 60/703,945, filed Jul. 30, 2005, and Ser. No. 60/797,848, filed May 6, 2006, which are herein incorporated by reference in their entirety.

FIELD OF THE INVENTION

The present invention relates to a condenser and a heat dissipation system utilizing the condenser. More specifically, the condenser has a blade-thru structure and further utilizes vibration to enhance the efficiency of heat exchange.

BACKGROUND OF THE INVENTION

With the never-ending increase of computing power, effectively cooling a CPU has become a technical challenge. The present temperature limit for a CPU is approximately 60° C. As the power of a CPU increases, more heat is generated; therefore, the CPU requires a higher efficiency and capacity of the heat dissipation device in order to provide effective thermal management to the computer system. Heat dissipation can be achieved by moving the heat generated primarily at the CPU and other components such as the memory controller, memory chips, graphics processor and power chips, to a location where it can be safely discharged to the ambient air.

One type conventional heat dissipation device is passive metal heat sinks. The heat sinks are typically made of thermally conductive metal blocks that can be attached to the cover plate of a CPU for dissipating heat. The block can be fabricated to include plurality of thin fins to increase the surface area for heat dissipation. The heat sinks are only effective to dissipate heat generated up to about 90 watts. Another type of conventional heat dissipation device is heat pipes, which are only effective to dissipate heat generated up to about 130 watts. Therefore, the conventional heat dissipation devices have very limited capacities and are inadequate for cooling the high power CPU, which operates with a power of about 235 watts.

At this time the computer industry in general believes that liquid cooling is the only viable solution for the immediate future. Recently, major computer manufacturers have started to release high power computers using liquid cooling devices for thermal management. For example, Dell's new top line system XPC 700 includes a refrigerated liquid cooling system. IBM has released its Power 6 Plus chip at 5.2 GHz, which operates with power in a range of 300 to 425 watts and is expected to be supported with liquid cooling devices. However, liquid cooling devices are expensive, noisy and difficult to maintain.

Therefore, there is a strong need in the computer industry for improved heat dissipation devices that have higher efficiency and capacity for thermal management of computer systems. Furthermore, there is also a strong need for improved heat dissipation devices in other industries, such as automobile and air conditioning.

SUMMARY OF THE INVENTION

In one aspect, the present invention is directed to a condenser core that has a blade-thru structure. In one embodiment, the condenser core comprises multiple substantially planar blades, each having at least one chamber formed monolithically therein. The floor of the chamber has at least one aperture, which includes at least one reed flap. The multiple blades are joined in parallel alignment, with the apertures positioned to permit vapor and condensate to pass through the apertures. The floor of the chamber vibrates when vapor passes through the apertures. The blades are made of a metal, preferably copper. The multiple condensation chambers are in a form of drawn chamber formed monolithically in each blade.

In another embodiment, a condenser core comprises multiple substantially planar blades joined in parallel by one or more spacer rings disposed between two adjacent blades. Each of the blades comprises one or more chambers formed within interiors of the spacer rings, and the floor of the chamber and the rest of the blades are monolithic. The floor of the chamber has at least one aperture. The chambers of the multiple blades are in alignment to permit vapor and condensate to pass through the apertures.

In another aspect, the present invention is directed to a component of a condenser core, which comprises a substantially planar blade having at least one chamber formed monolithically therein. The floor of the chamber has at least one aperture permitting vapor and condensate to pass through.

In a further aspect, the present invention is directed to a blade-thru condenser. In one embodiment, the condenser comprises a condenser core that comprises a plurality of substantially planar blades joined one on top of another along a longitudinal axis of the condenser core by joint interfaces formed between two adjacent blades. Each of the blades comprises one or more condensation chambers formed monolithically therein. The plurality of blades are so aligned that the condensation chambers of each blade are on top of the condensation chambers of the blade immediate underneath, thereby forming one or more phase exchange columns in parallel to the longitudinal axis of the condenser core. Each condensation chamber has one or more apertures on the floor thereof, permitting vapor and condensate to pass therethrough. The apertures include at least one reed flap, and the apertures vibrate when vapor passes through.

The condenser further comprises input and output interfaces. In one embodiment, the input interface is an input manifold disposed above, and hermetically sealed to, the upper end of the condenser core. The input manifold comprises a vapor inlet and multiple vapor outlets, each of the vapor outlets disposed above one of the multiple condensation chambers at the upper end of the condenser core. The output interface is an output manifold disposed underneath, and hermetically sealed to, a lower end of the condenser core. The output manifold comprises a condensate outlet and multiple condensate inlets, each of the condensate inlets disposed underneath one of the multiple condensation chambers at the lower end of the condenser core.

In yet a further embodiment, the condenser core of the blade-thru condenser comprises a plurality of substantially planar blades joined one on top of another along a longitudinal axis of the condenser core by multiple spacer rings disposed between two adjacent blades. Each blade comprises multiple condensation chambers formed within interiors of the spacer rings. The blades are so aligned that the multiple condensation chambers of each of the blades are disposed above the multiple condensation chambers of the blade immediate underneath, thereby forming multiple phase exchange columns. Each condensation chamber has one or more apertures on a floor thereof, permitting vapor and condensate to pass therethrough.

In one embodiment, each of the spacer rings has flat upper and lower surfaces. In another embodiment, each of the blades further includes one or more male bosses on an upper side and female bosses on an opposing lower side of each of the blades. Each male surrounds the floor of a condensation chamber. On the other hand, each spacer ring also has a male boss and a female boss on the upper end and the bottom thereof, respectively, which are complementary to the male boss and female boss of the blade for positioning spacer ring on the blade.

In a further aspect, the present invention is directed to a heat dissipation system, which comprises an evaporator, a blade-thru condenser of the present invention, and a coolant hermetically sealed therein. In one embodiment, the evaporator comprises a liquid boiler and a housing made of a thermal insulating material. The liquid boiler can be a metal boiler plate having a micro porous surface.

In one embodiment, the heat dissipation system comprises a conduit connecting between the evaporator and the condenser through the input interface and the output interface of the condenser. In another embodiment, the heat dissipation system comprises a vapor conduit connecting between a gas port of the evaporator and the input interface of the condenser, and a condensate conduit connecting between the output interface of the condenser and a liquid port of the evaporator.

The heat dissipation system further comprises a fan positioned adjacent to the condenser core, for providing ambient air circulation to the condenser core.

In yet a further aspect, the present invention is directed to a computer system, which utilizes the heat dissipation system of the present invention for thermal management of the computer. The boiler plate of the evaporator of the instant heat dissipation system is positioned in a direct contact with a heat generating component of the computer, such as the CPU of the motherboard, or memory controller, memory chips, graphics processor, or power chips. A fan is positioned in the vicinity of the condenser core to provide ambient air circulation to the condenser core.

The advantages of the present invention will become apparent from the following description taken in conjunction with the accompanying drawings showing the exemplary embodiments of the invention.

BRIEF DESCRIPTION OF THE DRAWINGS

FIG. 3A is a magnified cross-sectional view of a joint interface between two adjacent blades.

FIG. 3B is a magnified cross-sectional view of the reed flap of the semispherical aperture of the floor of the drawn chamber.

FIG. 7 is a top view of a blade of the blade-thru condenser shown in FIG. 6.

FIG. 7A is a partial exploded perspective view of FIG. 7.

FIG. 7B is an exploded cross sectional view of two adjacent blades of the condenser shown in FIG. 6, showing the mating relationship between the bosses of the blade and the spacer rings.

FIG. 7C is a perspective view of a spacer ring of condenser shown in FIG. 6, showing the female boss in the bottom of the spacer ring.

FIG. 8 is a top view of the input manifold of the condenser shown in FIG. 6.

FIG. 8A is a cross-sectional view of the input manifold along line 8-8' of FIG. 8.

FIG. 8B is a cross-sectional view of the input manifold along line 8A-8A' of FIG. 8A.

DETAILED DESCRIPTION OF THE INVENTION

In one aspect, the present invention provides a blade-thru condenser for facilitating a high efficiency liquid-gas phase exchange and heat dissipation.

Figure 1:
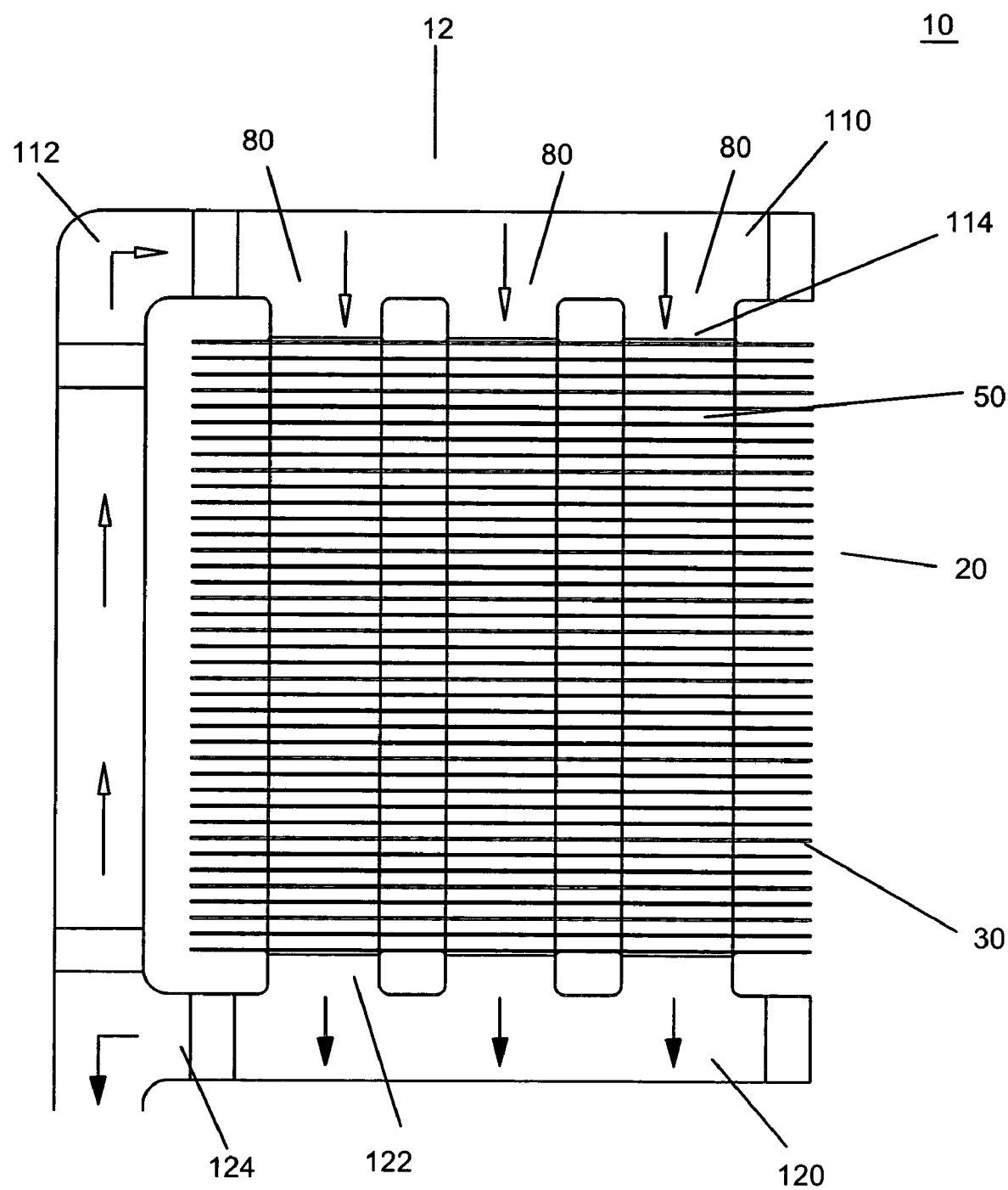
FIG. 1 is an illustrative cross-sectional view of the blade-thru condenser of one embodiment of the present invention.

In one embodiment, condenser 10 comprises a condenser core 20, an input manifold 110, and an output manifold 120, as shown in FIG. 1.

Referring to FIGS. 1, 2, 3, 3A and 3B, condenser core 20 comprises a plurality of substantially planar blades 30 joined one on top of another along a longitudinal axis 12 of condenser 10 by joint interfaces 40 formed between two adjacent blades. Each layer of blades 30 has multiple condensation chambers 50. In the embodiment shown, condensation chambers 50 are drawn chambers, which are formed monolithically in each blade. On floor 52 of each condensation chamber 50 there can be one or more apertures, or openings, 60, which permit vapor and condensate to pass therethrough and cause vibration of floor 52 of condensation chamber 50. As shown, a plurality of layers of blades 30 are so aligned that floors 52 of condensation chambers 50 of each layer of blade 30 are on top of walls 56 of condensation chambers 50 of blade 30 immediate underneath, thereby forming multiple phase exchange columns 80 in parallel to longitudinal axis 12. In the embodiment shown, each blade 30 of condenser core 20 includes three condensation chambers. However, the number of condensation chambers can vary depending on the desired capacity and/or size of the condenser. For example, in a low capacity condenser, each blade can have only one or two condenser chambers, and the condenser core has only one or two phase exchange column.

Blades 30 are made of heat conducting materials, preferably metal, such as copper or aluminum. In an exemplary embodiment, blade 30 is made of a copper blank; it has a length about 127 millimeters (mm), a width about 44.5 mm, and a thickness about 0.17 mm.

As shown, blades 30 are substantially planar except the areas having the drawn chambers. Between each two adjacent blades 30, there is a sufficient distance for dissipating heat released from the blades by convection driven by ambient air flow. In the exemplary embodiment described above, the distance between two adjacent blades is about 1.5 mm.

Figure 2:
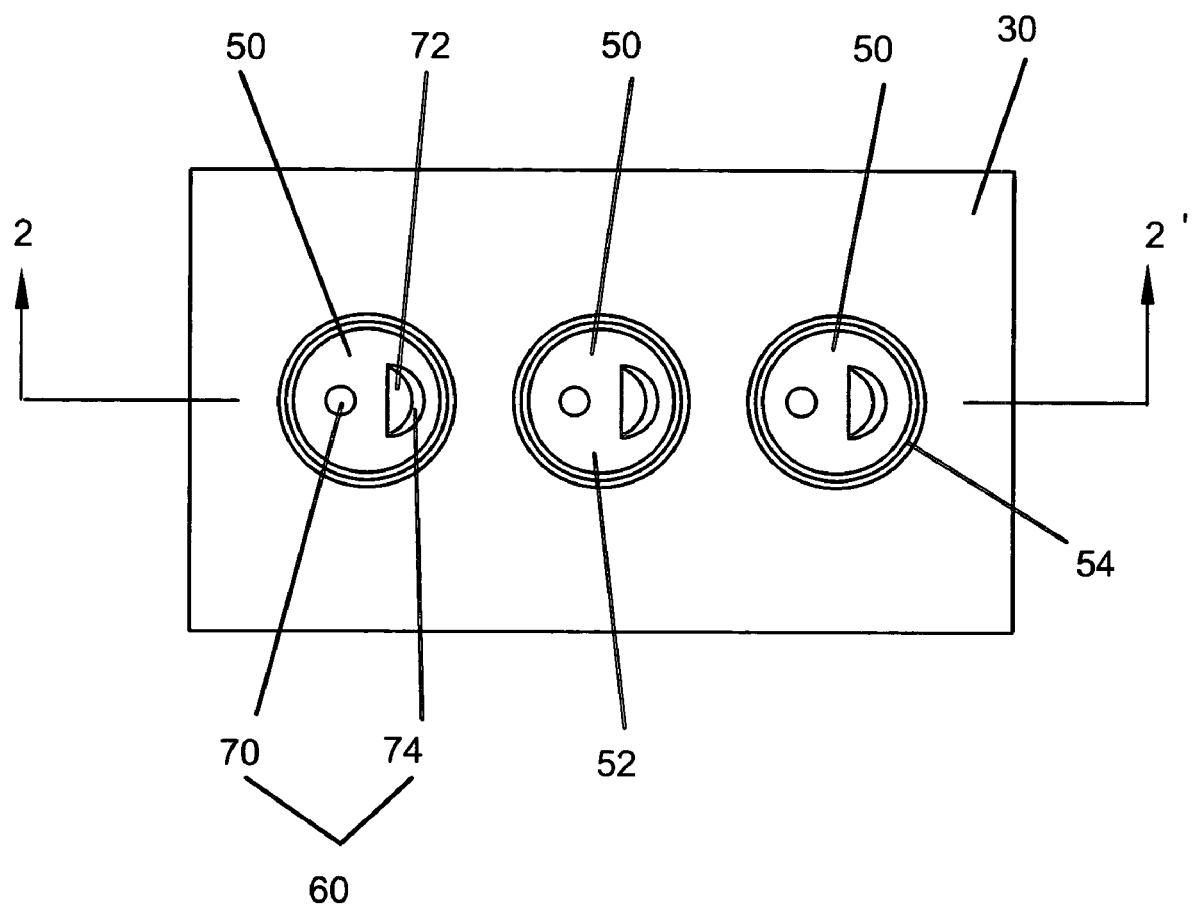
FIG. 2 is a top view of a blade of the condenser core of the condenser shown in FIG. 1.

To construct condenser core 20, multiple drawn chambers 50 (three are shown in FIG. 2) are formed monolithically in each blade 30. Two apertures 70 and 74 are fabricated on floor 52 of each drawn chamber 50. The cross sectional profile of a lower portion of wall 56 of each drawn chamber 50 is configured to interlock with a top portion 54 of the wall of drawn chamber 50 of the immediate underlying blade. FIG. 3A shows detailed structure of a joint interface 40 between two immediately adjacent blades 30 of one embodiment of the present invention, which can be jointed together by soldering, adhesive, or other suitable means. As shown, top portion 54 of wall 56 is a small planar recess, which provides a seating rim to the condensation chamber 50 of the blade immediate above.

It should be understood that in a preferred embodiment each blade 30 has a monolithic structure. Each drawn chamber 50 is an integral part of blade 30, and there is no interface of different materials between drawn chamber 50 and the rest of blade 30. This monolithic structure eliminates the metal to metal interfaces between a tubular core and separate fins affixed thereto by soldering or brazing, which are the interface structures used in most conventional condensers, radiators and heat exchangers. These metal to metal interfaces have intrinsically a significant thermal resistance, and therefore, seriously hinder the heat transfer from the tubular core to the fins.

Therefore, it can be understood that the term "blade-thru" used herein refers to such a structural feature wherein a monolithic blade is part of the chamber wherein phase exchange of vapor occurs, as well as the exterior fin. In the condenser so structured, along each layer of blade there is no interface between different materials at the transition point between the fin and the condensation chamber which, in function, corresponds to part of the conventional tubular core. Therefore, there is no hindrance to heat transfer from the floor of the condensation chamber to the fin.

Figure 3:
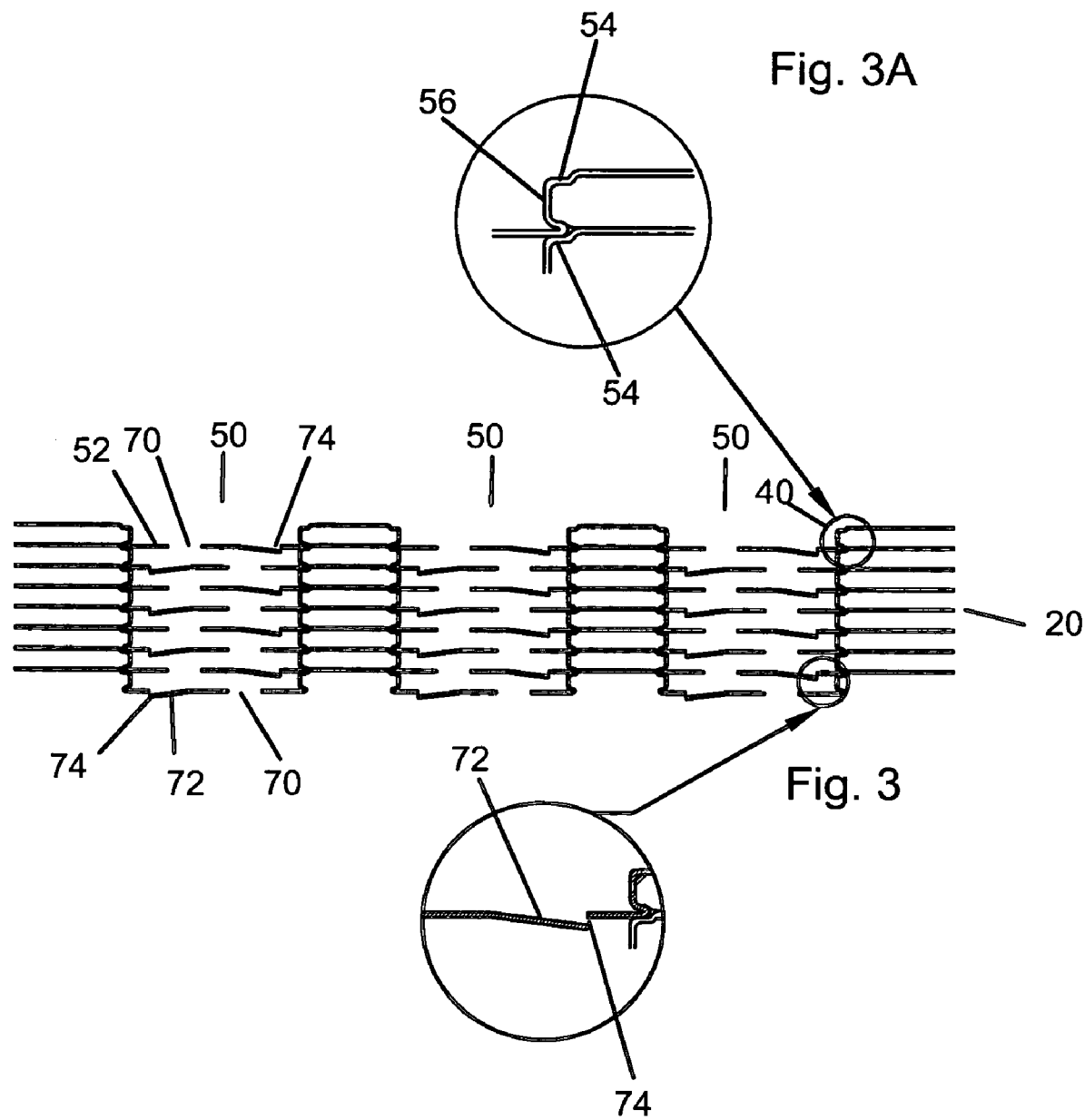
FIG. 3 is a partial enlarged cross-sectional view of the condenser core along line 2-2' of FIG. 2.

In one exemplary embodiment as shown in FIGS. 1 thru 3, condenser core 20 comprises about 40 planar blades 30, interconnected together as described above. In the embodiment shown, condensation chamber 50 has a circular shape with a diameter about 12 mm. In this structure, apertures 60 include an orifice 70 on one side of floor 52, and a semispherical aperture 74 on the other side of floor 52. The semispherical aperture 74 can be produced by partial piercing, which forms a reed flap 72. It noted that reed flap 72 is part of semispherical aperture 74, and in the context herein when the term of semispherical aperture 74 is used it refers to the aperture inclusive of the reed flap. In the structure shown, orifice 70 is circular. In one embodiment, orifice 70 has a diameter of 3 mm and semispherical aperture 74 has a height about 0.4 mm at the center of the aperture. However, orifice 70 can also have other shapes or geometries, such as elliptical, square, rectangular, triangle, elongated slot, etc. Similarly, semispherical aperture 74 can also have various other shapes and geometries; for example, an alternative aperture having a reed can be produced by a knife edge formed by a narrow slot cut, or other such cuts that produce a reed which can vibrate in a passage of vapor flow. Furthermore, the reed flap can have a different thickness between the edge portion and root portion that is adjacent to the wall of the chamber, and typically, the edge portion is thinner. In operation, the thinner the edge portion is, the lower the vapor pressure that triggers the vibration. Moreover, the temper, or hardness, of the metal also contributes to the triggering threshold of the vibration and the frequency of the vibration.

In the working environment of the blade-thru condenser of the present invention, orifice 70 and semispherical aperture 74 are vibratory openings, which vibrate when vapor passes through the apertures. Assume on the floor of each condensation chamber there is only an orifice 70. In the hermetically sealed condenser 10, which is connected to an evaporator by conduits, as vapor enters a phase exchange column from the upper end of the condenser core, it travels down the column by passing through orifice 70 in every condensation chamber. The vapor flow, more specifically, the pressure difference between the upper and lower sides of the floor of the condensation chamber, induces vibration of the floor. The vibration is in multiple frequencies.

On the other hand, if each condensation chamber only has a semispherical aperture 74, as vapor travels down, it also induces vibration of the floor; and the vibration can be initiated at a lower vapor pressure, or a lower pressure difference between the upper and lower sides of the floor, in comparison to the situation where the floor only has orifice 70. This can be appreciated by the fact that a much lower pressure difference, which is also referred to as differential pressure, can cause vibration of reed flap 72, hence, induce the vibration of the floor. This vibration is also in multiple frequencies, yet can be in a different frequency range from the situation described above.

When both orifice 70 and semispherical aperture 74 are present on the floor of condensation chamber 50, as shown in FIGS. 2 and 3, the vibration can be initiated by different vapor pressures, or pressure differences, and the vibration frequencies also have a broader spectrum. This results in an enhancement of heat exchange efficiency of the condenser, as further described hereinafter. Moreover, it can be appreciated that the vibration of the condensation chambers might cause the vapor to pass the apertures in an oscillatory manner, which in turn, could further enhance the vibration of the floors. It should be understood that combinations of other suitable aperture structures or configurations can also be used to achieve the same effect.

Therefore, the term of vibratory opening or aperture used herein refers to one or more apertures on a thin blade, which vibrates when exposed to a passage of vapor flow or a differential pressure. This is similar to the working mechanism of a Helmholtz resonator.

Furthermore, it can be appreciated that within condenser core 20, the vapor pressure decreases from the upper end to the lower end, as the vapor travels down and converts into condensate upon releasing heat to the blades, and hence, the pressure difference between the upper and lower sides of the floor also decreases in the downward direction. To compensate for the effect of the pressure gradient, the dimensions as well as structures of the vibratory apertures can be different at different locations along the longitudinal axis of the condenser core. For example, the apertures toward the lower end can have more reeds, and narrower reeds, which tend to vibrate even under a low differential pressure.

Further details of the structure and operation of condenser 10 are described hereinafter in reference of FIGS. 1 and 3. As shown, within one phase exchange column 80, the first blade 30 from the upper end of condenser core 20 has its orifice 70 aligned above semispherical aperture 74 of the second blade 30, and its semispherical aperture 74 aligned above orifice 70 of the second blade 30. In this sense, orifices 70 and semispherical apertures 74 of two immediate adjacent blades 30 are misaligned. However, orifices 70 and semispherical apertures 74 of every alternate layer of blades are in alignment, therefore, the positioning of orifices 70 and semispherical apertures 74 is bilaterally symmetric.

As vapor enters each phase exchange column from input manifold 110, it passes through orifices 70 and semispherical apertures 74 forming a vapor column, which causes vibration of floor 52 of each condensation chamber 50. Furthermore, as can be visualized in FIG. 3, with the bilaterally symmetric arrangement within each phase exchange column 80, the vapor travels down with a zig-zag pathway through orifices 70 and semispherical apertures 74, which forces the vapor to have a maximum contact with the metal surface, and hence to achieve a maximum heat exchange between the vapor and the metal. On the other hand, the angle of reed flap 72 also facilitates the condensate to flow down through semispherical apertures 74 within the column. It should be understood, however, that the bilaterally symmetric arrangement is only one of possible arrangement of the vibratory apertures, and various other structures and arrangements of the vibratory apertures can be used for the purpose of the present invention.

In the process of continuous heat exchange inside the condenser, the condensate formed in each condensation chamber flows down within columns 80. The vibration of the chamber floor reduces retention of the condensate within the condenser chamber. Furthermore, it is known that the liquid film temporarily formed by the condensate on the metal surface insulates the metal from a direct contact with the vapor, which slows down the rate of heat exchange between the vapor and the metal, therefore, could reduce the heat exchange efficiency of the condenser. With the structure and the operation mechanism of condenser core 20 of the present invention, this film effect has been substantially reduced by the vibration of the floor induced by the vibratory apertures in each condensation chamber, as described above. The vibration reduces the liquid film formation and retention on the surface of condenser chamber, and hence, reduces the loss of heat exchange efficiency caused by this film.

Moreover, it can be further appreciated when the metal vibrates within the flow of the vapor, the effective surface contact between the higher temperature vapor to the lower temperature metal is maximized. Therefore, vibration of the metal increases the heat transfer from the vapor to the metal beyond the heat transfer occurring in a static environment, because of the increased effective surface contact between the metal and the surrounding column of vapor.

As described above, the condenser core of the present invention utilizes the monolithic and integral blade-thru structure and preferably vibratory effect to substantially enhance heat exchange efficiency, it is hence, also referred to as a blade-thru Helmholtz condenser.

Condenser 10 has a vapor input interface in the form of input manifold 110, and a condensate output interface in the form of output manifold 120. In the embodiment shown in FIGS. 1 and 5, both input manifold 110 and output manifold 120 have a tubular structure. Input manifold 110 has a tubular vapor inlet 112 and multiple vapor outlets 114. Each vapor outlet 114 is disposed directly above a condensation chamber 50 at the upper end of condenser core 20. The vapor generated by an evaporator enters input manifold 110 through vapor inlet 112, and then enters each phase exchange column 80 through one of the vapor outlets 114. Output manifold 120 has a condensate outlet 124 and multiple condensate inlets 122. Each condensate inlet 122 is disposed underneath one condensation chamber 50 of the blade 30 at the lower end of condenser core 20. The condensate enters from each phase exchange column 80 into output manifold 120 through condensate inlets 122, and then exits output manifold 120 from condensate outlet 124. In the embodiment shown in FIG. 1, the beginning portion of tubular vapor inlet 112 of input manifold 110 is in common with condensate outlet 124 of output manifold 120. Furthermore, in this embodiment, input manifold 110 and output manifold 120 are made of a metal, as both manifolds are welded directly to condenser core 20 to form a hermetically sealed structure.

Figure 6:
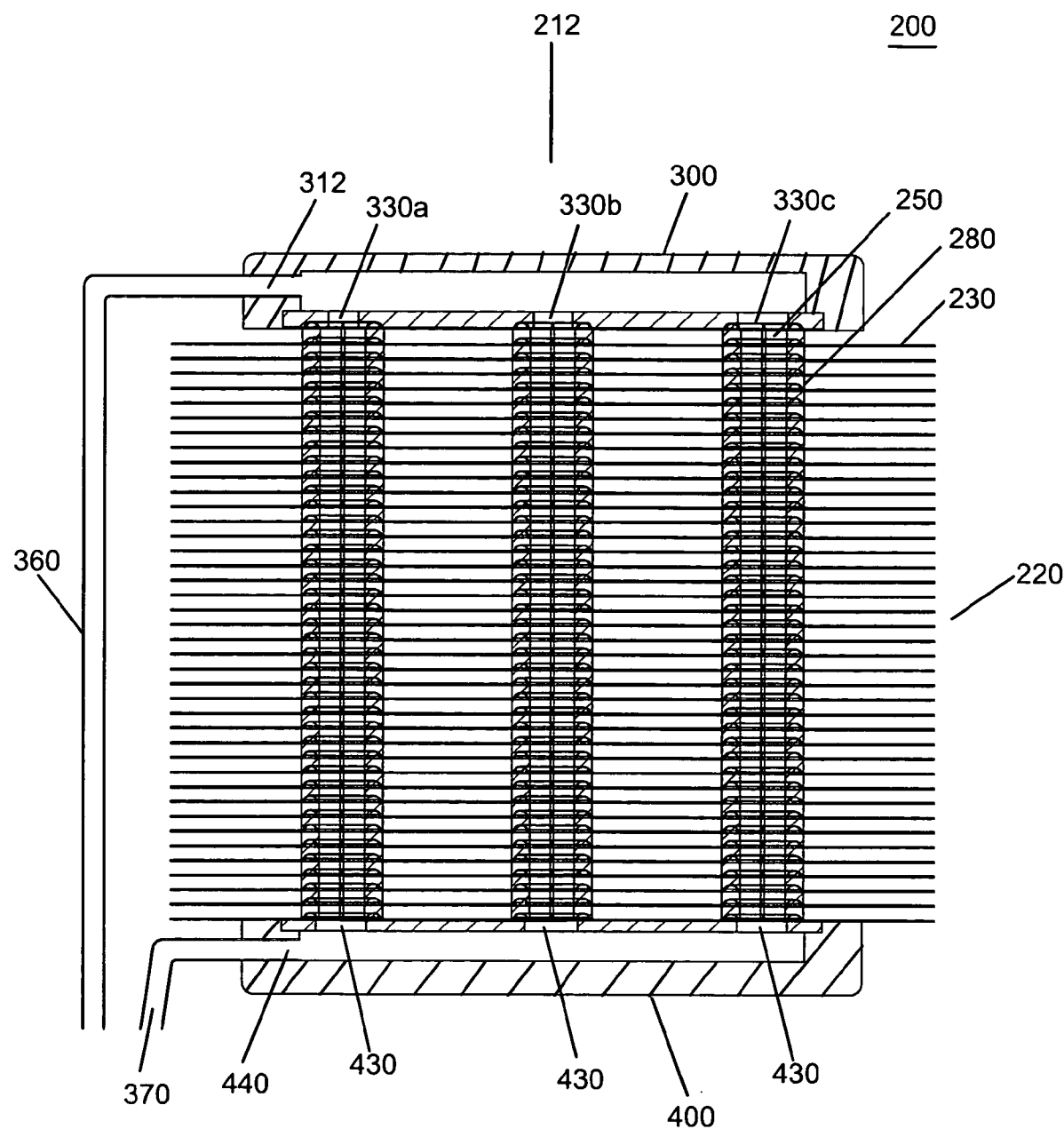
FIG. 6 is a cross sectional view of the blade-thru condenser of a further embodiment of the present invention.

FIG. 6 shows a cross sectional view of blade-thru condenser 200 of a further embodiment of the present invention, which has a different condensation chamber structure and the interface between adjacent blades. Referring to FIGS. 6 thru 9A now, condenser 200 comprises condenser core 220, input manifold 300 disposed on top of condenser core 220, and output manifold 400 disposed underneath condenser core 220.

In the embodiment shown in FIGS. 6 thru 7C, condenser core 220 comprises forty planar blades 230 and each blade 230 has three condensation chambers 250. Condensation chambers 250 are formed using spacer rings 290 disposed between two adjacent blades 230. In an exemplary embodiment, blade 230 is made of a copper blank; it has a length about 127 mm, a width about 44.5 mm, and a thickness about 0.17 mm. The spacer ring 290 has a height 292 about 1.5 mm, a length about 12 mm and a width about 8 mm. The interior surface 298 of spacer ring 290 forms the wall of condensation chamber 250. As shown in FIGS. 7A and 7B, floor 252, within the interior of spacer ring 290, of a condensation chamber 250 is substantially in the same plane of the rest of blade 230. Each floor 252 of condensation chambers 250 is surrounded by an oval shape male boss 240 on the upper side of blade 230, and on the lower side of blade 230 there is an oval shape female boss 242. As shown, each spacer ring 290 has a female boss 294 at the bottom of the spacer ring, which is complementary to male boss 240 of blade 230 for positioning spacer ring 290 on top of male boss 240. On the upper end of spacer ring 290, there is a male boss 296, surrounded by a flat flange 295 on the outside. Male boss 296 of spacer ring 290 is complementary to female boss 242 of blade 230. In construction, three spacer rings 290 are placed on three male bosses 240 of a blade 230, each having female boss 294 mating with male boss 240. Then, another blade 230 is placed on top of the three spacer rings 290, with female bosses 242 on the lower side of the blade mating with male bosses 296 of the spacer rings and with the lower side of the blade sitting on the flat flanges 295. As such, three condensation chambers 250 are formed between two adjacent blades 230. Spacer rings 240 can be attached to blades 230 by soldering, by adhesive, or other suitable processes, to form an air and liquid tight connection. The formed condenser core 220, and input manifold 300 and output manifold 400 attached thereto, form a hermetically sealed condenser system.

The female and male bosses described above can be formed by stamping using the processes known to those having ordinary skill in the art. The mating bosses of the blade and the spacer rings function as a positioning guide to provide alignment means for proper positioning of spacer rings 290 and alignment of the blades.

Spacer ring 290 can be made of metal such as copper, aluminum, stainless steel, plastic, ceramic or other suitable materials. In a preferred example, spacer ring 290 is made of aluminum, which is a poorer heat conductive material in comparison to copper. In this configuration, the heat transfer by conduction between adjacent blades, other than by vapor, is reduced. This can further enhance the temperature difference between the upper portion of condenser core 220 where the vapor enters, and the lower portion of condenser core 220 where the condensate exits the condenser. Consequently, the condensate produced has a low temperature, with a minimum premature heating within the condenser by conductive heat transfer between the blades.

In this embodiment, the structure of the vibratory apertures 260 is substantially equivalent to apertures 60 described above, which include an orifice 270 on one side of floor 252, and a semispherical aperture 274 on the other side of floor 252, wherein semispherical aperture 274 includes a reed flap 272. The condenser core 220 is formed with blades 230 stacking one on top another along longitudinal axis 212, with spacer rings 290 in-between each two adjacent blades 230, thereby forming three phase exchange columns 280. The condensation chamber 250 formed has an oval shape, however, it can also be circular or other suitable shapes.

Figure 10B:
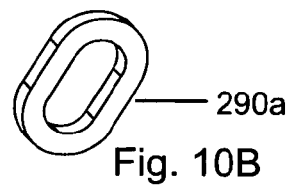
FIG. 10B is a perspective view of a spacer ring shown in FIG. 10A.
Figure 10A:
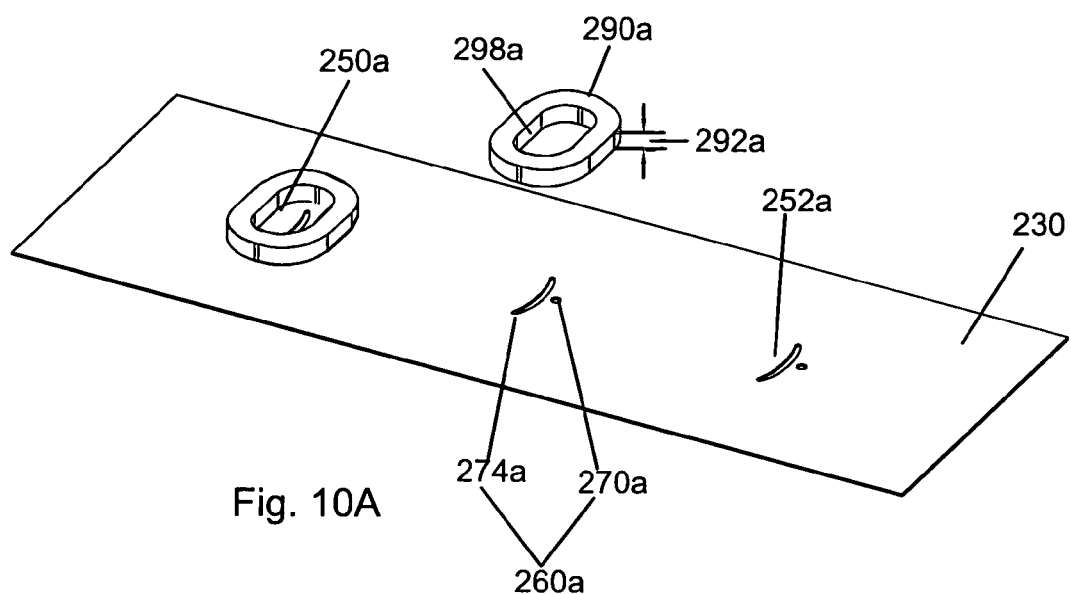
FIG. 10A is a partial exploded view, showing the condensation chamber formed by the blade and the spacer rings.
Figure 10:
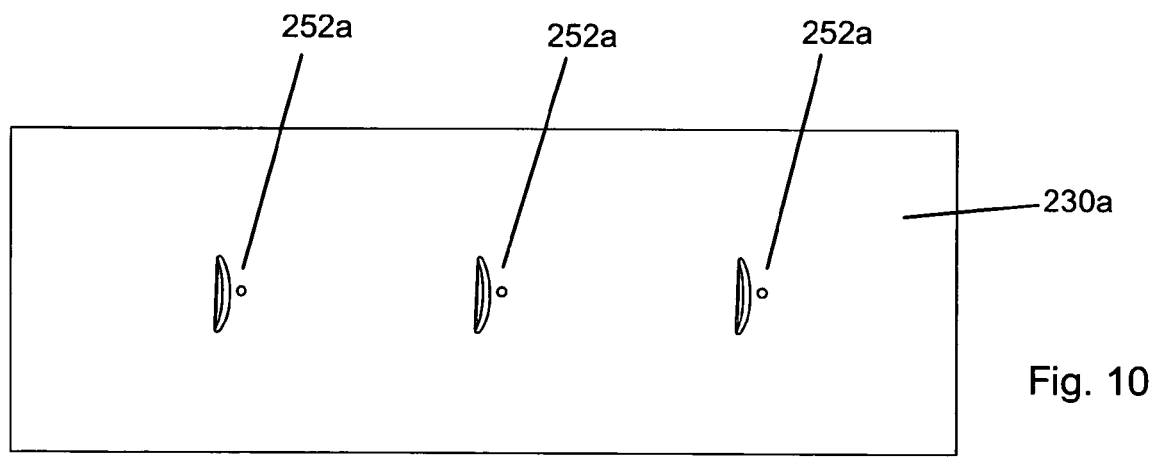
FIG. 10 is a top view of a blade of the condenser core of another embodiment of the present invention, without the spacer rings thereon.

In another alternative embodiment as shown in FIGS. 10 thru 10B, condenser core is formed using a different type of spacer rings 290*a*. As shown, spacer ring 290*a* is a solid oval shape ring, with flat upper and lower surfaces, a height 292*a*, and an interior surface 298*a*. Three spacer rings 290*a* are disposed around floors 252*a* between two adjacent blades 230*a*, thereby forming condensation chambers 250*a*. In the embodiment shown, vibratory apertures 260*a* have the same structure of apertures 260 described above. Spacer ring 290*a* can have the same height as that of spacer ring 290 and can be attached to blades 230 by soldering, by adhesive or other suitable means. Spacer ring 290*a* can be properly positioned using external alignment means, or other suitable means and methods, during the construction of the condenser core. Similarly, the condenser core is formed with blades 230*a* stacking one on top another, with spacer rings 290*a* disposed in-between each two adjacent blades 230*a*.

As shown in FIGS. 6 and 8 thru 8B, input manifold 300 of condenser 200 is in a form of a chamber, having a case 310 and a base 320. Case 310 has a vapor inlet 312 to which a vapor conduit 360 is connected. There are multiple vapor outlets 330*a*, 330*b* and 330*c* in the form of through-holes on base 320. As shown in FIG. 6, input manifold 300 is disposed on top of condenser core 220, wherein each vapor outlet is positioned directly above a condensation chamber 250 on the first blade 230 of condenser core 220, for directing vapor into a phase exchange column 280 within condenser core 220. As shown in FIGS. 8A and 8B, vapor outlets 330*a*, 330*b* and 330*c* preferably have different diameters. The diameter of the vapor outlet increases as the distance of the vapor outlet to vapor inlet 312 increases, which compensates for the reduction of pressure as the distance between vapor inlet 312 and the vapor outlet increases. The varied diameters of the vapor outlets balance the amount of vapor entering into the three phase exchange columns 280, and prevent uneven distribution of the vapor pressure among the columns.

As described previously, each blade can have one or more condensation chambers. The number of vapor outlets in the input manifold and the number of condensate inlets in the output manifold vary accordingly. Furthermore, in the embodiments shown, the input manifold and the output manifold have either a tubular structure or a chamber-like structure. However, it should be understood that other suitable shapes or structures can also be used for the purpose of the present invention. In general, the condenser has an input interface for introducing vapor into the condenser core, and an output interface connecting to a conduit for transferring the condensate to an evaporator. When the condenser core has multiple phase exchange columns, as in the structures described above, the input manifold is designed to provide a proper distribution of the vapor into multiple phase exchange columns. However, if the blades have only one condensation chamber, hence the condenser core only has one phase exchange column, the vapor conduit can be directly connected to the upper end of the condenser core by a connection component, without the input manifold. Similarly, the condensate conduit can also be directly connected to the lower end of the condenser core by a connection component.

Figure 9:
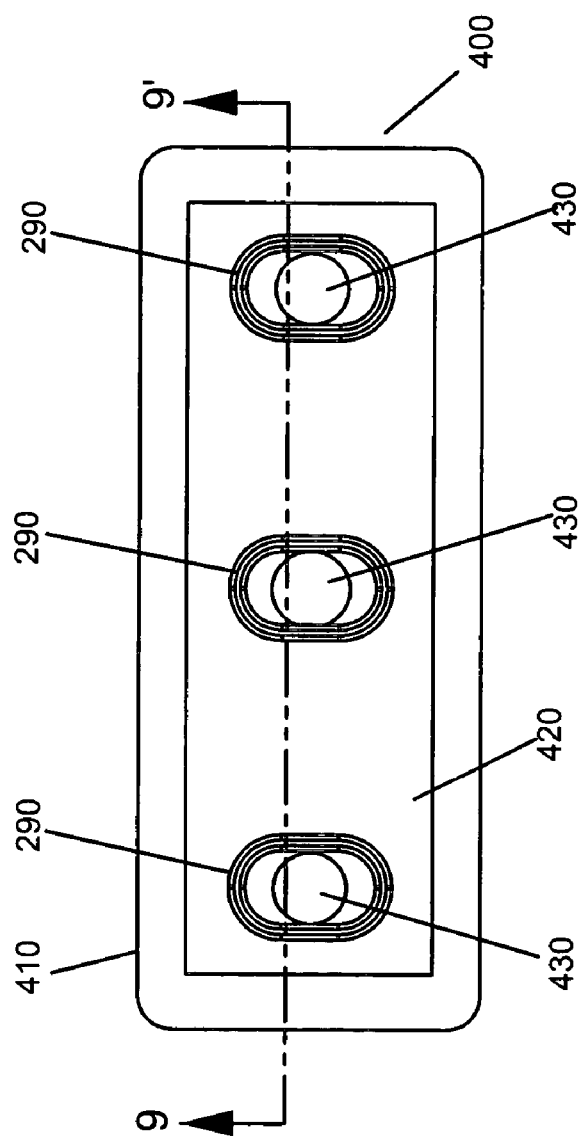
FIG. 9 is a top view of the output manifold of the condenser shown in FIG. 6.
Figure 9A:
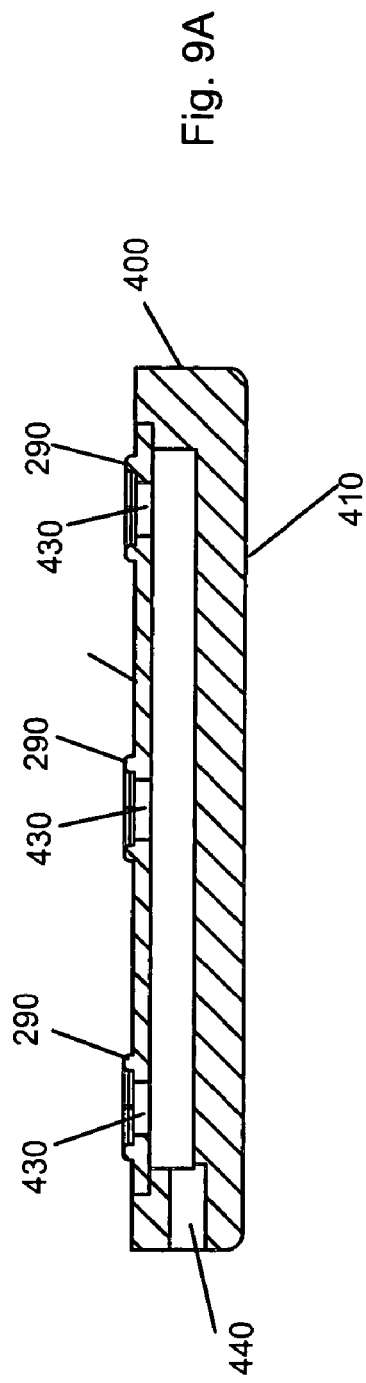
FIG. 9A is a cross-sectional view of the output manifold along line 9-9' of FIG. 9.

As shown in FIGS. 9 and 9A, output manifold 400 has a similar, yet reversed structure of the input manifold 300. Output manifold 400 comprises a case 410 and a top panel 420. There are multiple condensate inlets 430 in the form of through-holes on top panel 420. As shown in FIG. 9, a spacer ring 290 is positioned on top panel 420 around each condensate inlet 430. The lowest blade 230 of condenser core 220 is disposed on top of these spacer rings, with each condensate inlet 430 of output manifold 400 positioned directly underneath one condensation chamber 250, for collecting condensate flowing down from a phase exchange column 280 into case 410. Different from the vapor inlets of the input manifold, condensate inlets 430 can have the same diameter, because no vapor pressure difference needs to be compensated for at this location as only liquid is present. Output manifold 400 has a condensate outlet 440, to which a condensate conduit 370 (FIG. 11) is connected.

Input manifold 300 and output manifold 400 are preferably made of a thermal-insulating material. Suitable thermal-insulating materials include, but are not limited to, thermoplastic, for example, epoxy plastic, diallyl phthalate, diallyl isophthalate, and phenolic resin, and ceramic. In one exemplary embodiment, LE grade Garolite sheet from McMaster Carr, Atlanta Ga. is used. This material is composed of several layers of a fine weave cotton fabric that is compressed, heated and cured in phenolic resin.

In a further aspect, the present invention provides heat dissipation systems which utilize the condensers described above.

Figure 4:
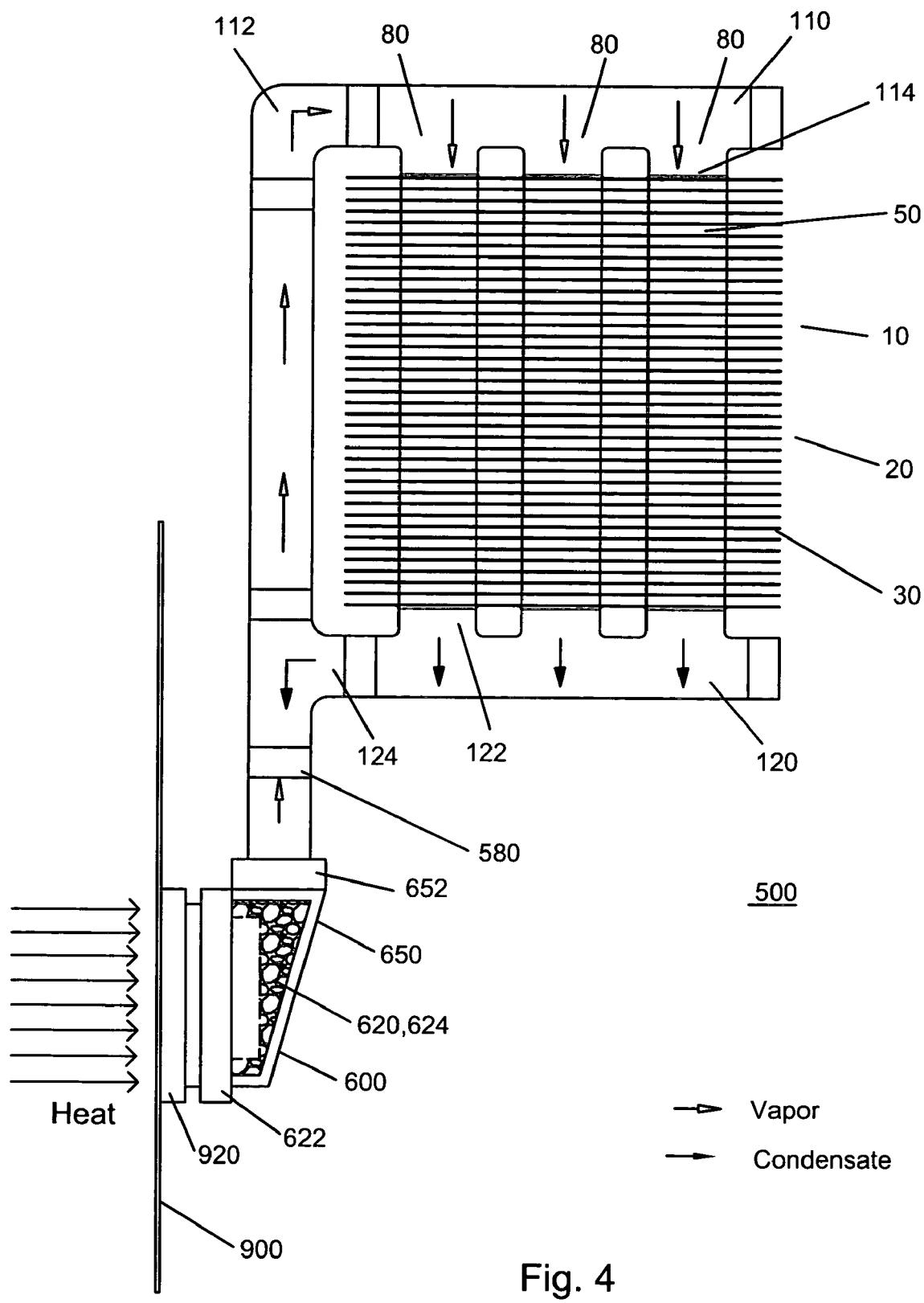
FIG. 4 is an illustrative cross-sectional view of a heat dissipating system of one embodiment of the present invention.
Figure 5:
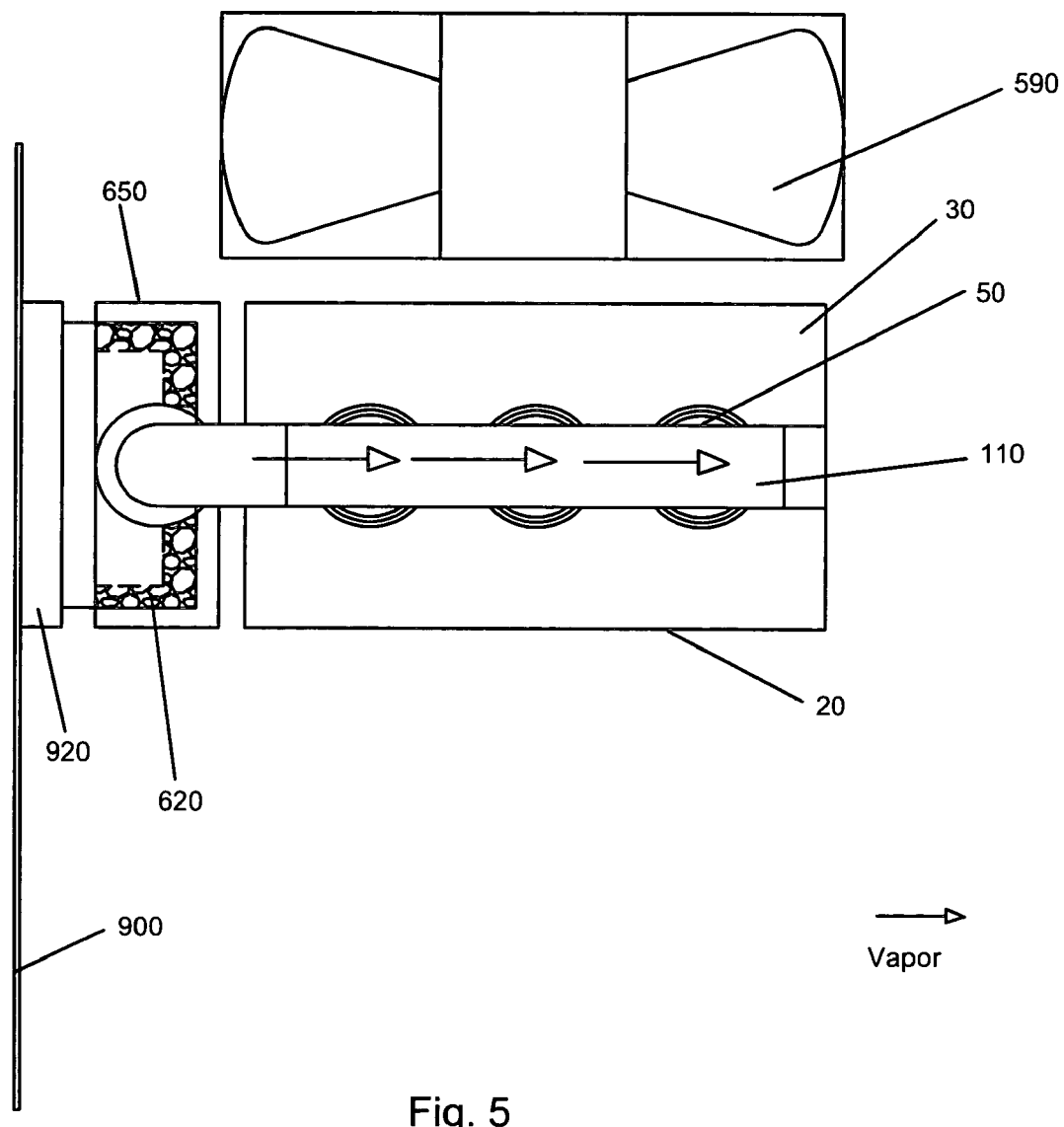
FIG. 5 is a top view of the heat dissipating system shown in FIG. 4.

As shown in FIGS. 4 and 5, in one embodiment heat dissipation system 500 comprises an evaporator 600, blade-thru condenser 10 described above, and a conduit 580 connected between the evaporator and condenser. Heat dissipation system 500 further comprises a fan 590 positioned adjacent to condenser core 20 for providing ambient air circulation through blades 30. For the purpose of illustration, heat dissipation system 500 is configured to adapt to a CPU 920 of a computer's motherboard 900 for dissipating heat generated at the CPU. However, it should be understood that the heat dissipation systems described herein can also be used for dissipating or transferring heat from other heat sources.

In the embodiment shown, evaporator 600 comprises a housing 650, which is also referred to as decoupling evaporation chamber, and a liquid boiler 620 enclosed therein. Liquid boiler 620 in general has a base 622 and an evaporation surface 624 to facilitate the phase transfer of a liquid to vapor. The evaporation surface 624 can be copper wool, heat conducting open cell foam material, or other suitable materials. The liquid boiler can also be a boiler plate coated with micro porous coating material, as described in detail hereinafter.

In the embodiment shown, decoupling evaporation chamber 650 further includes an interface chamber 652 at the interface between decoupling evaporation chamber 650 and conduit 580. Both decoupling evaporation chamber 650 and interface chamber 652 are made of a thermal insulating material, such as those described above. In an exemplary embodiment, decoupling evaporation chamber 650 is made of Conapoxy RN-1000, an epoxy plastic material, from Cytec Industries, Olean, N.Y. Decoupling evaporation chamber 650 inhibits conductive heat transfer from base 622 of the liquid boiler through the chamber to conduit 580, therefore, thermally decouples evaporator 600 from condenser 10. The terms decoupling and decouple used herein refer to the effect of inhibiting the conductive heat transfer from the base of the evaporator which is in a direct contact with the heat source, such as the CPU, through the walls of the chamber or housing of the evaporator, to the condenser. This can be achieved either by using an evaporator chamber made of a thermal insulating material, or an interface segment made of thermal insulating material, positioned between the evaporator and the condenser.

Conduit 580 has a first end connected to the upper end of decoupling evaporation chamber 650, more specifically, interface chamber 652, and a second end connected to the joint section of tubular vapor inlet 112 and condensate outlet 124 of the inlet and outlet manifolds of condenser 10. Preferably, conduit 580 is made of flexible material, such as corrugated stainless steel or copper alloy tubing or other suitable materials, which provides the flexibility of positioning the condenser. Furthermore, the material used for the conduits is impermeable to refrigerant, and preferably is poor in conducting heat. Corrugated stainless steel tubing possesses these preferred properties.

Heat dissipation system 500 further comprises an aqueous coolant. Suitable coolants include, but are not limited to, deionized water, refrigerant, such as refrigerant HFE7000 manufactured by 3M (St. Paul, Minn.) and refrigerant R-245FA manufactured by Honeywell (Morristown, N.J.). A predetermined amount of an aqueous coolant is placed into evaporator 600 and heat dissipation system 500 is sealed under vacuum. The operation of heat dissipation system 500 is illustrated in FIG. 4, wherein evaporator 600 is attached to CPU 920 of a computer with the bottom surface of base 622 in a direct contact with the CPU.

In operation, as the heat is transferred conductively from CPU 920 to base 622 of liquid boiler 620, the coolant absorbs the heat and evaporates. As shown by the open arrows in FIG. 4, the vapor generated in evaporator 600 travels through conduit 580, enters input manifold 110 through vapor inlet 112, then subsequently enters condenser core 20 through vapor outlets 114. The high temperature and high pressure vapor passes through orifices 70 and semispherical apertures 74 of condensation chambers 50 (see FIG. 3), and travels down in phase exchange columns 80. Upon contacting with blades 30, the vapor releases heat and converts back into liquid condensate. As the vapor passes through the vibratory apertures, it causes vibration of floors 52, which reduces the condensate film on the surface of the condensation chamber. The vibration effect maximizes the surface contact between the metal and the vapor as described above, which increases the efficiency of heat exchange of the condenser. The condensate formed (solid arrows) flows through condensate inlets 122 into output manifold 120, exits condensate outlet 124 and flows back to evaporator 600 through conduit 580. The condensate in evaporator 600 is then heated up by the heat absorbed from the CPU and converted into vapor again. The vapor travels to condenser 10, and the cooling cycle described above repeats again.

Preferably, conduit 580 is a flexible corrugated conduit because when a single conduit is used, corrugated conduit provides an effective separation of the returned condensate from the pathway of the vapor, and reduces heat exchange between the vapor and the condensate.

In the configuration shown, fan 590 is positioned immediately adjacent to condenser core 20, which blows ambient air toward blades 30 in a direction transverse to the longitudinal axis 12 of condenser core 20, to dissipate heat released from blades 30 to the surrounding environment. However, fan 590 can also be positioned within the computer case in the vicinity of the condenser core, to provide a sufficient ambient air circulation through blades of condenser core 20. Another possible arrangement in an environment of the computer can include two fans, one fan pulls in relatively cooler ambient air from the outside of the case, and the other fan pulls out the hot air inside the case to the outside of the case. In a further possible arrangement, the fan adjacent to the condenser core is disposed within a duct connected to a computer case opening which leads to the outside of the case.

The operation of the heat dissipation system utilizing the blade-thru condenser of the present invention has been described above using evaporators 600. However, various other evaporators can be used with the blade-thru condenser of the present invention. It should be understood that the operational mechanism of the blade-thru condenser of the present invention is independent of the structure of the evaporator, although the performance of the heat dissipation system can be affected by the structure and efficiency of a specific evaporator as well as the arrangement of the system.

Figure 11:
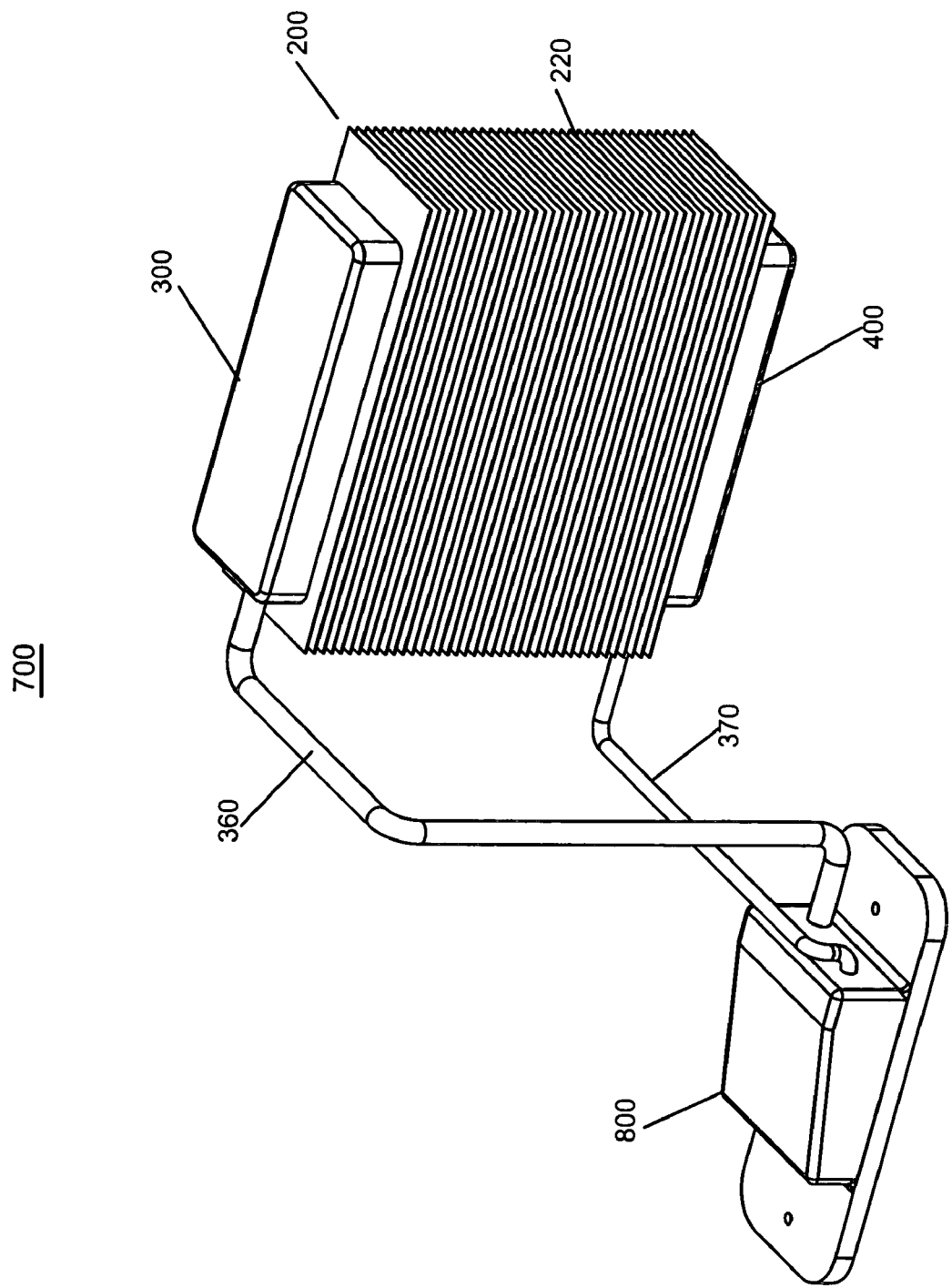
FIG. 11 is a perspective view of the heat dissipation system in one embodiment of the present invention.

In a further embodiment as shown in FIG. 11, heat dissipation system 700 comprises an evaporator 800, blade-thru condenser 200 described above, and vapor conduit 360 and condensate conduit 370 connected between the evaporator and the condenser. Similarly, heat dissipation system 700 further comprises a fan positioned immediately adjacent to condenser core 220, or alternatively positioned in the vicinity of condenser core, for providing ambient air circulation through blades 230.

Figure 12A:
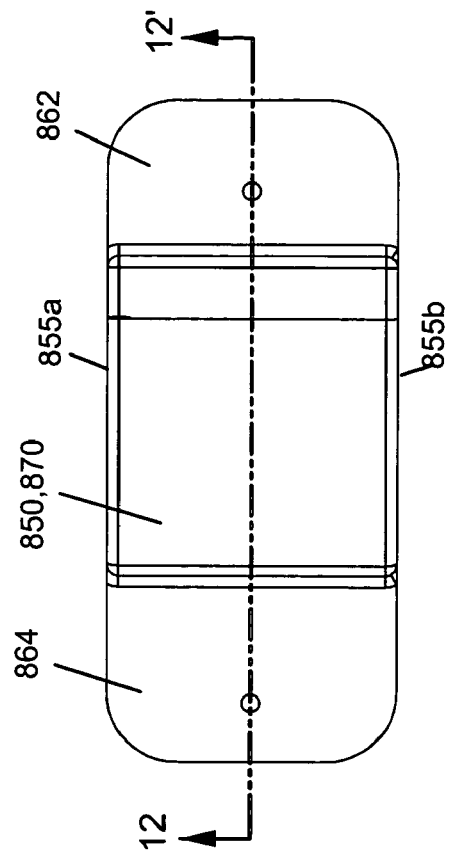
FIGS. 12, 12A and 12B are perspective, top and cross sectional views of the evaporator of the heat dissipation system shown in FIG. 11.
Figure 12B:
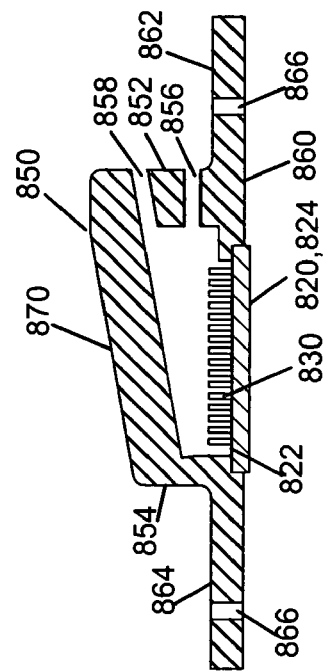
Figure 12:
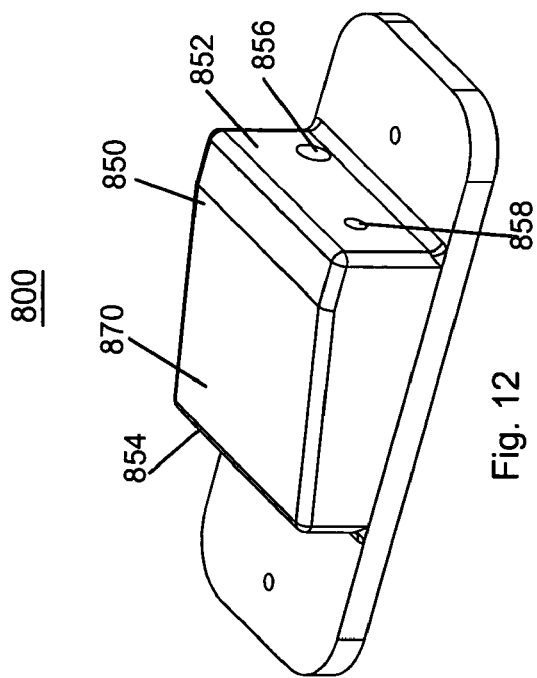
Figure 13:
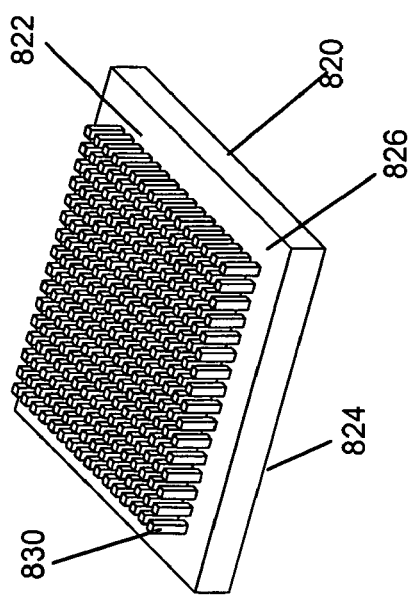
FIG. 13 is a perspective view of the boiler plate of the evaporator shown in FIG. 12.

As shown in FIGS. 12 thru 13, evaporator 800 comprises a boiler plate 820 and an evaporator housing 850, which is also referred to as decoupling evaporation chamber. Boiler plate 820 has an upper surface 822, a bottom surface 824, and a plurality of pins 830 extending upward from upper surface 822. Preferably, upper surface 822 and pins 830 are coated with a micro porous coating material, and the resulted boiler plate is referred to as micro porous boiler plate. Boiler plate 820 is made of a heat conductive material, preferably a metal, for example, copper. For use with a CPU, a boiler plate can have a shape that generally conforms with the shape of the CPU. Typically the boiler plate can have a dimension of about 40 mm by about 40 mm. The micro porous area is about 30 mm by about 30 mm. In one embodiment, pin 830 has a square cross section, with a dimension of about 1 mm by 1 mm and a height about 4 mm. It should be understood that the pins can have other suitable shapes, such as circular or triangle cross sections. Furthermore, if the boiler plate is also to be in contact with other heat generating components around the CPU, the size and the shape of the boiler plate can be changed accordingly.

The micro porous boiler plate is known in the art. Various materials and processes can be used for making the micro porous boiler plate for the purpose of the present invention. In one method, an oil is dispensed onto the pins and the upper surface of the boiler plate to form a fine coating. Fine copper particles approximately 10 μm in diameter are broadcasted on to the oil coated surface. The coated plate is then heated in an oxygen free oven to a temperature that burns off the oil coating, which causes the copper particles to fuse at their tangent points. This process forms micro chambers or open cells about 5 μm in diameter in the space between particles. This geometry is ideal for generating micro bubbles, and has been confirmed to be extremely effective in converting a liquid to a vapor. The operating mechanism of the micro porous boiler plate has been described in detail by Tehver et al. "Heat Transfer and Hysteresis Phenomena in Boiling on Porous Plasma-Sprayed Surface" *Experimental Thermal and Fluid Science* 1992; 5:714-727, which is herein incorporated by reference in its entirety.

Figure 14:
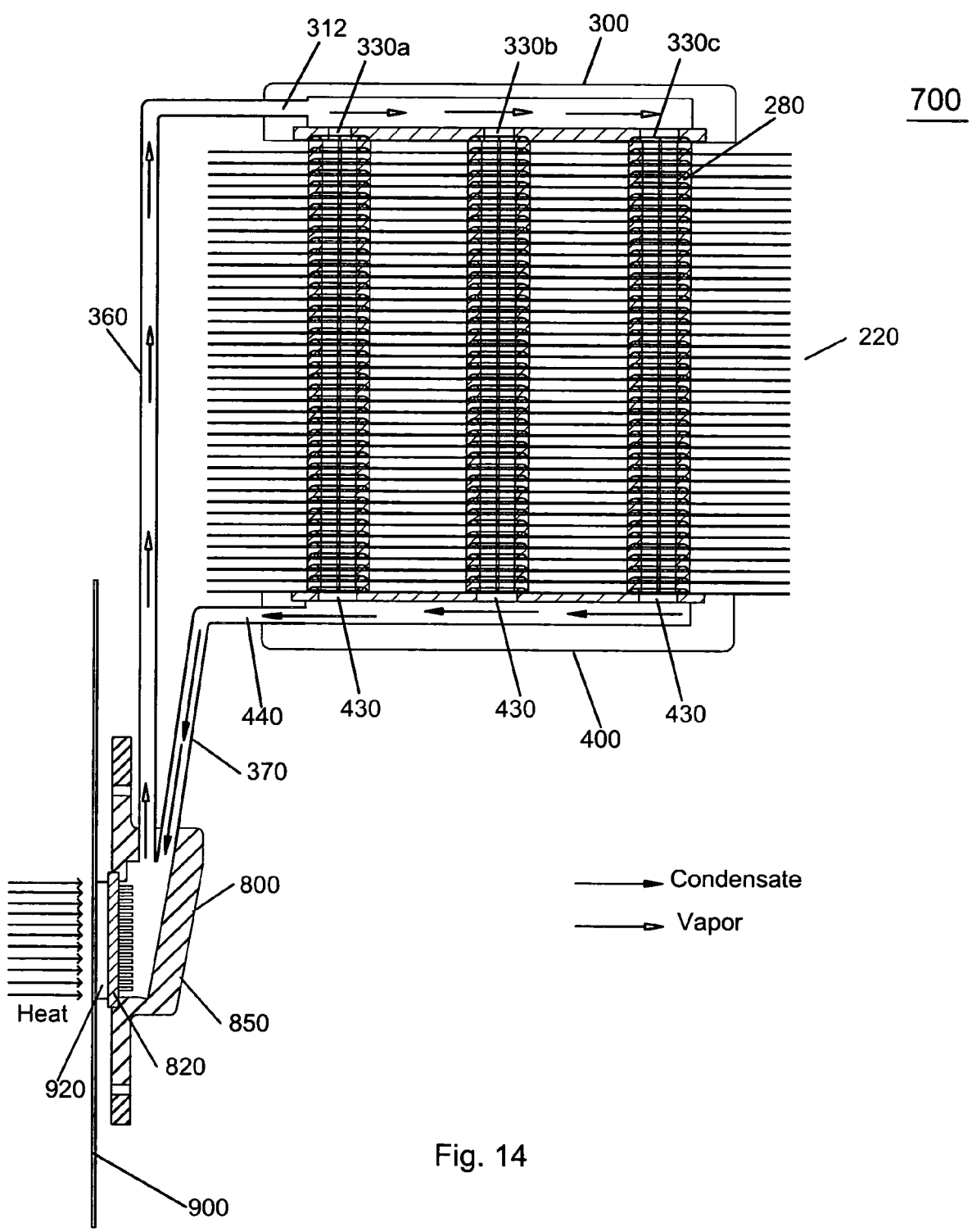
FIG. 14 is a schematic view showing the flows of vapor and condensate within the heat dissipation system shown in FIG. 11.

Evaporator housing 850 includes side walls 852, 854, 855a and 855b, a top wall 870 and a base 860 connected to periphery 826 of boiler plate 820. The top wall 870 inclines, from the first side wall 852 to the second side wall 854, toward boiler plate 820. The inclined top wall 870 provides the flexibility of positioning evaporator in two different orientations, i.e., horizontal orientation of the boiler plate 820 as shown in FIG. 11, or a vertical orientation as shown in FIG. 14. Inclined top wall 870 can assist in guiding the distribution of condensate to the distal end (near the second side wall 854) of the evaporator.

As shown in FIGS. 12 and 12B, housing 850 has a vapor port 856 and a condensate port 858 positioned on first side wall 852. Vapor port 856 is connected to vapor conduit 360, and a condensate port 858 is connected to condensate conduit 370 (see FIG. 11). In the configuration shown, base 860 has two anchoring flanges, 862 and 864, each having an aperture 866 for fastening the evaporator to a device which needs heat dissipation, in other words, the heat source.

Housing 850 is made of a thermal-insulating material as described above, which minimizes the conductive heat transfer from boiler plate 820 to housing 850, in turn, minimizes the conductive heat transfer to the conduits and the condenser. Furthermore, housing 850 insulates the heat inside the evaporator from the environment, which maximizes the heat carried out by the vapor. In an exemplary embodiment, housing 850 is made of Conapoxy RN-1000, as described above. Preferably, housing 850 has an integral single piece structure, which can be produced by injection plastic molding.

Preferably, conduits 360 and 370 are made of a flexible material, such as corrugated stainless steel or copper alloy tubing, or other suitable materials. As described previously, the material used for the conduits is impermeable to refrigerant, and preferably is poor in conducting heat.

Similarly, heat dissipation system 700 further comprises a coolant. Suitable coolants have been described above. A predetermined amount of an aqueous coolant is placed into evaporator 800 and heat dissipation system 700 is sealed under vacuum. It is noted that all connections between the evaporator and the conduits and between the condenser and the conduits are air and liquid tight. In operation, when the refrigerants described above are used, they evaporate at a temperature about 30° C., and the vapor pressure in the evaporator can be from about 10 psi to about 25 psi.

The operation of heat dissipation system 700 is illustrated in FIG. 14, also see FIGS. 11 and 12B, wherein evaporator 800 is in a vertical orientation. As shown, evaporator 800 is attached to a CPU 920 of a computer's motherboard 900 for dissipating heat generated at CPU, with bottom surface 824 of boiler plate 820 in a direct contact with the cover plate of the CPU. In general, the bottom surface 824 of boiler plate 820 is to be placed in direct contact with a contact surface of a heating generating device.

In operation, as the heat is transferred conductively from CPU 920, or other heat generating devices, to boiler plate 820, nucleated boiling occurs on top of the micro porous upper surface 822 and pins 830. Hence, this micro porous surface is herein also referred to as the nucleated boiling surface. The coolant absorbs heat and evaporates. As shown by the open arrows in FIG. 14, the vapor generated in evaporator 800 travels through vapor conduit 360, enters vapor inlet 312 of input manifold 300, and enters phase exchange columns 280 of condenser core 220 through vapor outlets 330a, 330b and 330c. As described above, the high temperature and high pressure vapor passes through orifices 270 and semispherical apertures 274 of condensation chambers 250 (FIG. 7), travels down in phase exchange columns 280. Upon contacting with the blades, the vapor releases heat and converts back into liquid condensate within phase exchange columns 280. In this process, the vapor passes through the vibratory apertures, it causes vibration of the floor, which reduces the condensate film on the surface of the condensation chamber. The vibration maximizes the effective surface contact between the metal and the vapor as described above, which increases heat exchange efficiency of the condenser. The condensate formed (solid arrows) flows through condensate inlets 430 into output manifold 400 driven by gravity, and exits condensate outlet 440 and flows back to evaporator 800 through condensate conduit 370.

Upon returning into evaporator 800, the condensate diffuses on the nucleated boiling surface by a capillary effect of the micro porous structure, which is then heated up again by the heat absorbed from the CPU, and is converted into vapor again. As such, the evaporation and condensation processes continue repetitively within the heat dissipation system, and the phase change from the liquid form to the gas form and from the gas form back to the liquid form effectively removes heat from the CPU, or other heat generating devices, to a surrounding environment.

Using two separate conduits in heat dissipation system 700 substantially reduces heat exchange between the vapor and the condensate during their traveling between the evaporator and the condenser. As the vapor leaves the evaporator, it enters vapor conduit 360 without physical contact with the returning condensate; therefore, the vapor remains at its high temperature and effectively carries heat into the condenser. On the other hand, as the condensate exits the condenser, it does not contact the rising vapor; therefore, the condensate remains at its low temperature when it returns back into the evaporator. Furthermore, separation of the vapor and the condensate eliminates the counter current forces of the outgoing vapor imposed on the returning condensate. Such a counter current impedes return of the condensate driven by gravity.

Moreover, preferably, both vapor conduit 360 and condensate conduit 370 are thermally insulated from the ambient environment. Thermal insulation reduces heat exchange between the vapor inside the vapor conduit and the environment, and therefore, maximizes the heat carried by the vapor into the condenser. Similarly, thermal insulation also reduces heat exchange between the condensate and the environment, which minimizes premature heating of condensate by the environment and maintains the condensate at a low temperature as it enters the evaporator.

Consequently, heat dissipation system 700 of the present invention maintains high temperature vapor as it enters into the condenser and also maintains low temperature condensate as it enters into the evaporator. In other words, the heat dissipation system maximizes the temperature difference ($\Delta T$) between the vapor and the condensate. It can be appreciated that the lower the temperature of the condensate is, the faster the conductive heat transfer will be from the boiler plate to the condensate, and more heat will be absorbed in the process of evaporation. Therefore, using two separate conduits further enhances the efficiency of the evaporator.

The blade-thru condenser of the present invention has made a revolutionary breakthrough in the structure of a condenser. It has abandoned the conventional tube and fin structure and has created a monolithic and integral structure between the condensation chambers (corresponding to the conventional tube) and the fins. Furthermore, this is the first time that vibratory apertures have been integrated into a condenser, which utilizes vibration for enhancement of heat exchange efficiency by inhibiting the film formation and retention of the condensate on the surface of the condensate chambers.

The invention has been described with reference to particularly preferred embodiments. It will be appreciated, however, that various changes can be made without departing from the spirit of the invention, and such changes are intended to fall within the scope of the appended claims. While the present invention has been described in detail and pictorially shown in the accompanying drawings, these should not be construed as limitations on the scope of the present invention, but rather as an exemplification of preferred embodiments thereof. It will be apparent, however, that various modifications and changes can be made within the spirit and the scope of this invention as described in the above specification and defined in the appended claims and their legal equivalents. All patents and other publications cited herein are expressly incorporated by reference.

What is claimed is:

1. A blade-thru condenser comprising:
   (a) a condenser core comprising a plurality of substantially planar blades joined one on top of another along a longitudinal axis of said condenser core by joint interfaces formed between two adjacent blades; each of said blades comprising one or more condensation chambers formed monolithically therein, each chamber having a floor; said plurality of blades being so aligned that said floor of said one or more condensation chambers of each of said blades is disposed above said one or more condensation chambers of one of said blades immediate underneath, thereby forming one or more phase change columns in parallel to said longitudinal axis of said condenser core; said each chamber having one or more open apertures including a reed flap on said floor, permitting vapor and condensate to pass therethrough; said reed flap on each of said blades not in contact with said floor of said condensation chamber immediate underneath or above, and having an orientation substantially parallel to said floor; said floor separating spaces above and below said floor between adjacent chambers such that when a vapor flow passes through said one or more open apertures on said floor, a pressure difference between upper and lower sides of said floor causes said reed flap to vibrate;
   (b) an input interface; and
   (c) an output interface.

2. The condenser of claim 1, wherein said one or more condensation chambers are drawn chambers formed monolithically in each of said blades.

3. The condenser of claim 1, wherein said joint interfaces are an interface between a lower portion of a wall of one of said condensation chambers and an upper portion of said wall of one of said condensation chamber immediate underneath.

4. The condenser of claim 1, wherein a distance between said two adjacent blades is sufficient to permit convection of ambient air.

5. The condenser of claim 1, wherein said input interface is an input manifold disposed above, and hermetically sealed to, an upper end of said condenser core, said input manifold comprising a vapor inlet and one or more vapor outlets, each of said vapor outlets disposed above one of said one or more condensation chambers at said upper end of said condenser core; and said output interface is an output manifold disposed underneath, and hermetically sealed to, a lower end of said condenser core, said output manifold comprising a condensate outlet and one or more condensate inlets, each of said condensate inlets disposed underneath one of said one or more condensation chambers at said lower end of said condenser core.

6. A blade-thru condenser comprising:
   (a) a condenser core comprising a plurality of substantially planar blades joined one on top of another along a longitudinal axis of said condenser core by one or more spacer rings disposed between two adjacent blades; each of said blades comprising one or more condensation chambers formed within interiors of said spacer rings, wherein an area of said blades enclosed within said spacer ring forms a floor of said chamber and said spacer ring forms a wall of said chamber and there is an air-tight seal between said spacer ring and said blades; said plurality of blades being so aligned that said one or more condensation chambers of each of said blades are disposed above said one or more condensation chambers of one of said blades immediate underneath, thereby forming one or more phase change columns in parallel to said longitudinal axis of said condenser core; said chamber having one or more open apertures including a reed flap on said floor thereof, permitting vapor and condensate to pass therethrough, said reed flap on each of said blades not in contact with said floor of said condensation chamber immediate underneath or above, and having an orientation substantially parallel to said longitudinal axis of said condenser core: said floor separating spaces above and below said floor between adjacent chambers such that when a vapor flow passes through said one or more open apertures on said floor, a pressure difference between upper and lower sides of said floor causes said reed flap to vibrate;
   (b) an input interface; and
   (c) an output interface.

7. The condenser of claim 6, wherein a distance between said two adjacent blades is sufficient to permit convection of ambient air.

8. The condenser of claim 6, wherein said input interface is an input manifold disposed above, and hermetically sealed to, an upper end of said condenser core, said input manifold comprising a vapor inlet and one or more vapor outlets, each of said vapor outlets disposed above one of said one or more condensation chambers at said upper end of said condenser core; and said output interface is an output manifold disposed underneath, and hermetically sealed to, a lower end of said condenser core, said output manifold comprising a condensate outlet and one or more condensate inlets, each of said condensate inlets disposed underneath one of said one or more condensation chambers at said lower end of said condenser core.

9. The condenser of claim 8, wherein diameters of said vapor outlets of said input manifold increase as a distance of said vapor outlets to said vapor inlet increases.

10. The condenser of claim 6, wherein said spacer rings are made of a material different from a material of said blades, having a lower thermal conductivity than said thermal conductivity of said blades.

11. The condenser of claim 10, wherein said spacer rings are attached to said blades by an adhesive, or by soldering to form said air-tight seal between said blades and said spacer rings.

12. The condenser of claim 6, wherein each of said blades further includes one or more male bosses on an upper side and female bosses on an opposing lower side of each of said blades; each of said male bosses surrounding said floor of one of said condensation chambers.

13. The condenser of claim 12, wherein each of said spacer rings has a female boss on a bottom thereof, complementary to each of said male bosses of said blades for positioning each of said spacer rings on each of said male bosses of said blades; and each of said spacer rings has a male boss on an upper end thereof, surrounded by a flat flange; said male boss of each of said spacer rings being complementary to each of said female bosses of said blades.

14. A condenser core comprising multiple substantially planar blades, each of said multiple blades having at least one chamber formed monolithically therein, said chamber having a floor and having at least one open aperture including a reed flap on said floor; said multiple blades joined in parallel alignment, with said at least one open aperture of each of said blades positioned to permit vapor and condensate to pass through said at least one open aperture; said reed flap on each of said blades not in contact with said floor of said chamber immediate underneath or above, and having an orientation substantially parallel to said longitudinal axis of said condenser core; said floor separating spaces above and below said floor between adjacent chambers such that when a vapor flow passes through said one or more open apertures on said floor, a pressure difference between upper and lower sides of said floor causes said reed flap to vibrate.

15. The condenser core of claim 14, wherein said multiple blades are joined by a joint interface formed between two adjacent blades.

16. A condenser core comprising multiple substantially planar blades joined in parallel by one or more spacer rings disposed between two adjacent blades; each of said blades comprising one or more chambers formed within interiors of said spacer rings, wherein an area of said blades enclosed within said spacer ring forms a floor of said chamber and said spacer ring forms a wall of said chamber and there is an air-tight seal between said spacer ring and said blades; said floor of said one or more chambers having at least one open aperture including a reed flap, said chambers of said multiple blades in alignment, permitting vapor and condensate to pass through said open apertures; said reed flap on each of said blades not in contact with said floor of said condensation chamber immediate underneath or above, and having an orientation substantially parallel to said longitudinal axis of said condenser core; said floor separating spaces above and below said floor between adjacent chambers such that when a vapor flow passes through said one or more open apertures on said floor, a pressure difference between upper and lower sides of said floor causes said reed flap to vibrate.

17. The condenser core of claim 16, wherein said floor of said chamber and rest of said blades are monolithic.

18. A heat dissipation system comprising:
(a) an evaporator;
(b) a condenser comprising:
  (i) a condenser core comprising a plurality of substantially planar blades joined one on top of another along a longitudinal axis of said condenser core by joint interfaces formed between two adjacent blades; each of said blades comprising one or more condensation chambers formed monolithically therein, each chamber having a floor; said plurality of blades being so aligned that said floor of said one or more condensation chambers of each of said blades is disposed above said one or more condensation chambers of one of said blades immediate underneath, thereby forming one or more phase change columns in parallel to said longitudinal axis of said condenser core; said each chamber having one or more open apertures including a reed flap on said floor thereof, permitting vapor and condensate to pass therethrough; said reed flap on each of said blades not in contact with said floor of said condensation chamber immediate underneath or above, and having an orientation substantially parallel to said floor; said floor separating spaces above and below said floor between adjacent chambers such that when a vapor flow passes through said one or more open apertures on said floor, a pressure difference between upper and lower sides of said floor causes said reed flap to vibrate;
  (ii) an input interface; and
  (iii) an output interface; and
(c) one or more conduits connecting between said evaporator and said condenser through said input interface and said output interface.

19. The heat dissipation system of claim 18, wherein said input interface is an input manifold disposed above, and hermetically sealed to, an upper end of said condenser core, said input manifold comprising a vapor inlet and one or more vapor outlets, each of said vapor outlets disposed above one of said one or more condensation chambers at said upper end of said condenser core; and said output interface is an output manifold disposed underneath, and hermetically sealed to, a lower end of said condenser core, said output manifold comprising a condensate outlet and one or more condensate inlets, each of said condensate inlets disposed underneath one of said one or more condensation chambers at said lower end of said condenser core.

20. The heat dissipation system of claim 19 further comprising a fan positioned adjacent to said condenser core, for providing ambient air circulation to said condenser core.

21. The heat dissipation system of claim 18, wherein said evaporator comprises a liquid boiler and a housing made of a thermal insulating material.

22. A heat dissipation system comprising:
(a) an evaporator;
(b) a condenser comprising:
  (i) a condenser core comprising a plurality of substantially planar blades joined one on top of another along a longitudinal axis of said condenser core by one or more spacer rings disposed between two adjacent blades; each of said blades comprising one or more condensation chambers formed within interiors of said spacer rings, wherein an area of said blades enclosed within said spacer ring forms a floor of said chamber and said spacer ring forms a wall of said chamber and there is an air-tight seal between said spacer ring and said blades; said plurality of blades being so aligned that said one or more condensation chambers of each of said blades are disposed above said one or more condensation chambers of one of said blades immediate underneath, thereby forming one or more phase change columns in parallel to said longitudinal axis of said condenser core; said chamber having one or more open apertures including a reed flap on said floor, permitting vapor and condensate to pass therethrough; said reed flap on each of said blades not in contact with said floor of said condensation chamber immediate underneath or above, and having an orientation substantially parallel to said floor; said floor separating spaces above and below said floor between adjacent chambers such that when a vapor flow passes through said one or more open apertures on said floor, a pressure difference between upper and lower sides of said floor causes said reed flap to vibrate;
  (ii) an input interface; and
  (iii) an output interface;

(c) a vapor conduit having a first end connected to said evaporator and a second end connected to said input interface of said condenser; and (d) a condensate conduit having a first end connected to said output interface of said condenser and a second end connected to said evaporator.

23. The heat dissipation system of claim 22, wherein said input interface is an input manifold disposed above, and hermetically sealed to, an upper end of said condenser core, said input manifold comprising said vapor inlet and one or more vapor outlets, each of said vapor outlets disposed above one of said one or more condensation chambers at said upper end of said condenser core; and said output interface is an output manifold disposed underneath, and hermetically sealed to, a lower end of said condenser core, said output manifold comprising said condensate outlet and one or more condensate inlets, each of said condensate inlets disposed underneath one of said one or more condensation chambers at said lower end of said condenser core.

24. The heat dissipation system of claim 22 further comprising a fan positioned adjacent to said condenser core, for providing ambient air circulation to said condenser core.

25. The heat dissipation system of claim 22, wherein said evaporator comprises a liquid boiler and a housing made of a thermal insulating material.

26. The heat dissipation system of claim 22, wherein said liquid boiler is a metal boiler plate having a micro porous surface.

27. A computer system comprising:
(a) a housing;
(b) a motherboard comprising a central processing unit (CPU) and input and output interfaces;
(c) a fan disposed within said housing; and
(d) a heat dissipation system comprising an evaporator, a condenser, and a coolant hermetically sealed therein, said condenser comprising:
a condenser core comprising multiple substantially planar blades, each of said multiple blades having at least one chamber formed monolithically therein, said chamber having a floor and having at least one open aperture including a reed flap on said floor; said multiple blades jointed in parallel alignment, with said open apertures positioned to permit vapor and condensate to pass through said open aperture; said reed flap on each of said blades not in contact with said floor of said chamber immediate underneath or above, and having an orientation substantially parallel to said floor; said floor separating spaces above and below said floor between adjacent chambers such that when a vapor flow passes through said one or more open apertures on said floor, a pressure difference between upper and lower sides of said floor causes said reed flap to vibrate; an input interface and an output interface; and
said evaporator comprising an evaporator housing and a boiler plate, said boiler plate being in a direct contact with a heat generating component of said computer.

28. The computer system of claim 27, wherein said heat generating component is said CPU of said motherboard.

29. The computer system of claim 27, wherein said heat generating component comprises memory controller, memory chip, graphics processor, or power chip.

30. A computer system comprising:
(a) a housing;
(b) a motherboard comprising a central processing unit (CPU) and input and output interfaces;
(c) a fan disposed within said housing; and
(d) a heat dissipation system comprising an evaporator, a condenser, and a coolant hermetically sealed therein, said condenser comprising:
a condenser core comprising a plurality of substantially planar blades joined one on top of another along a longitudinal axis of said condenser core by one or more spacer rings disposed between two adjacent blades; each of said blades comprising one or more condensation chambers formed within interiors of said spacer rings; wherein an area of said blades enclosed within said spacer ring forms a floor of said chamber and said spacer ring forms a wall of said chamber and there is an air-tight seal between said spacer ring and said blades; said plurality of blades being so aligned that said one or more condensation chambers of each of said blades are disposed above said one or more condensation chambers of one of said blades immediate underneath, thereby forming one or more phase change columns in parallel to said longitudinal axis of said condenser core; said chamber having one or more open apertures including a reed flap on said floor, permitting vapor and condensate to pass therethrough; said reed flap on each of said blades not in contact with said floor of said condensation chamber immediate underneath or above, and having an orientation substantially parallel to said floor; said floor separating spaces above and below said floor between adjacent chambers such that when a vapor flow passes through said one or more open apertures on said floor, a pressure difference between upper and lower sides of said floor causes said reed flap to vibrate;
an input interface and an output interface; and
said evaporator comprising an evaporator housing and a boiler plate, said boiler plate being in a direct contact with a heat generating component of said computer.

* * * * *